(12) United States Patent
Ku et al.

(10) Patent No.: US 11,244,141 B2
(45) Date of Patent: Feb. 8, 2022

(54) DISPLAY DEVICE INCLUDING BIOMETRIC INFORMATION SENSING UNIT

(71) Applicant: SAMSUNG DISPLAY CO., LTD., Yongin-si (KR)

(72) Inventors: Kyowon Ku, Seoul (KR); Junghak Kim, Hwaseong-si (KR); Youngsik Kim, Yongin-si (KR); Jinwoo Kim, Hwaseong-si (KR); Soongyu Lee, Daegu (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/104,927

(22) Filed: Nov. 25, 2020

(65) Prior Publication Data

US 2021/0174050 A1    Jun. 10, 2021

(30) Foreign Application Priority Data

Dec. 6, 2019 (KR) .......................... 10-2019-0161815

(51) Int. Cl.
*G06K 9/00* (2006.01)
*H01L 25/18* (2006.01)
*G06F 3/041* (2006.01)

(52) U.S. Cl.
CPC .......... *G06K 9/0004* (2013.01); *G06F 3/041* (2013.01); *H01L 25/18* (2013.01); *G06F 2203/04105* (2013.01)

(58) Field of Classification Search
CPC ..... G06K 9/0004; H01L 25/18; H01L 27/323; H01L 27/3241; G06F 3/041;
(Continued)

(56) References Cited

U.S. PATENT DOCUMENTS 10,282,581 B2   5/2019  Park et al.
2017/0351850 A1* 12/2017 Jin ....................... H04W 12/068
(Continued)

FOREIGN PATENT DOCUMENTS

KR      10-1894029      10/2016
KR     10-2019-0047985   5/2019
(Continued)

*Primary Examiner* — Premal R Patel
(74) *Attorney, Agent, or Firm* — F. Chau & Associates, LLC

(57) ABSTRACT

A display device, including: a display unit including a light emitting element that emits light, and a biometric information sensing unit disposed below the display unit, is provided, wherein the biometric information sensing unit receives light reflected by a biometric input, wherein the biometric information sensing unit includes: an optical system including a transmission part that passes the reflected light and an absorption part around the transmission part, wherein the absorption part absorbs the reflected light and pressure; a light detection sensor disposed below the transmission part of the optical system, wherein the light detection sensor receives the reflected light that passes through the transmission part; and a pressure detection sensor disposed below the absorption part of the optical system, wherein the pressure detection sensor detects the pressure that is transferred from the absorption part.

20 Claims, 17 Drawing Sheets

(58) Field of Classification Search
CPC ............ G06F 2203/04105; G06F 1/16; G06F 3/0414; G06F 3/042; G06F 3/04144; G06F 3/0412

See application file for complete search history.

(56) References Cited

U.S. PATENT DOCUMENTS

| | | | |
|---|---|---|---|
| 2018/0160545 A1* | 6/2018 | Kim | H05K 3/363 |
| 2018/0196985 A1* | 7/2018 | Ling | H01L 27/3246 |
| 2018/0321780 A1* | 11/2018 | Park | G06F 3/041 |
| 2019/0130157 A1* | 5/2019 | Oh | G06F 1/3265 |
| 2019/0172875 A1 | 6/2019 | Kang et al. | |
| 2019/0197285 A1* | 6/2019 | Shim | G06K 9/0002 |
| 2019/0205603 A1* | 7/2019 | Lee | H01L 27/3225 |

FOREIGN PATENT DOCUMENTS

| | | |
|---|---|---|
| KR | 10-2019-0053732 | 5/2019 |
| KR | 10-2019-0066433 | 6/2019 |

* cited by examiner

DISPLAY DEVICE INCLUDING BIOMETRIC INFORMATION SENSING UNIT

CROSS-REFERENCE TO RELATED APPLICATION

This U.S. non-provisional application claims priority under 35 U.S.C. § 119 to Korean Patent Application No. 10-2019-0161815, filed on Dec. 6, 2019 in the Korean Intellectual Property Office, the disclosure of which is incorporated by reference herein in its entirety.

TECHNICAL FIELD

Exemplary embodiments of the present invention relate to a display device, and more particularly, to a display device capable of recognizing biometric information.

DISCUSSION OF RELATED ART

A display device provides various functions that enable a user to interact with the display device. For example, the display device may display an image to provide information to the user or may detect the user's input. Display devices also may be implemented to detect the user's fingerprints.

Identification of fingerprints, for example, may be achieved through a capacitive type method based on a variation in capacitance between electrodes, an optical type method using an optical sensor to detect incident light, or an ultrasonic type method utilizing a piezoelectric material to detect vibration. In a display device, a sensor for detecting fingerprints may be assembled at a rear surface of its display panel. However, current sensing units for biometric information recognition may have a relatively long standby time. Accordingly, there is a need to reduce the standby time of such sensing units.

SUMMARY

Some exemplary embodiments of the present invention provide a display device that can reduce a standby time of a sensing unit for biometric information recognition.

According to some exemplary embodiments of the present invention, a display device may comprise: a display unit including a light emitting element that emits light; and a biometric information sensing unit disposed below the display unit, wherein the biometric information sensing unit receives light reflected by a biometric input. The biometric information sensing unit may comprise: an optical system including a transmission part that passes the reflected light and an absorption part around the transmission part, wherein the absorption part absorbs the reflected light and pressure; a light detection sensor disposed below the transmission part of the optical system, wherein the light detection sensor receives the reflected light that passes through the transmission part; and a pressure detection sensor disposed below the absorption part of the optical system, wherein the pressure detection sensor detects the pressure that is transferred from the absorption part.

In some exemplary embodiments, the biometric information sensing unit may further comprise a base substrate which includes a sensing area and a non-sensing area that surrounds the sensing area.

In some exemplary embodiments, the light detection sensor and the pressure detection sensor may be disposed in the sensing area of the base substrate.

In some exemplary embodiments, the sensing area may comprise an effective sensing area and an ineffective sensing area. The light detection sensor may be disposed in the effective sensing area. The pressure detection sensor may be disposed in the ineffective sensing area of the base substrate.

In some exemplary embodiments, the pressure detection sensor may comprise a pressure detection string.

In some exemplary embodiments, the pressure detection string may comprise: a plurality of strain detection patterns in the ineffective sensing area; and a connection pattern that connects the plurality of strain detection patterns to each other.

In some exemplary embodiments, the sensing area may comprise a plurality of unit sensing areas arranged in a matrix shape. Each of the plurality of unit sensing areas may comprise the light detection sensor.

In some exemplary embodiments, the optical system may comprise a plurality of optical fibers arranged in a matrix shape. The plurality of optical fibers may be disposed to correspond to the plurality of unit sensing areas.

In some exemplary embodiments, each of the plurality of optical fibers may comprise: a core part that serves as the transmission part; and a cladding part that surrounds the core part and serves as the absorption part.

In some exemplary embodiments, the core part may comprise: a lower portion having a first diameter; and an upper portion having a second diameter greater than the first diameter. The lower portion may be closer than the upper portion to the light detection sensor.

In some exemplary embodiments, the second diameter of the upper portion may decrease as it approaches the lower portion.

In some embodiments, the sensing area may comprise a plurality of unit sensing areas arranged in a matrix shape. Each of the plurality of unit sensing areas may comprise a plurality of effective sensing areas and an ineffective sensing area that is adjacent to the plurality of effective sensing areas.

In some exemplary embodiments, the light detection sensor may comprise a plurality of light detection sensors that are correspondingly provided in the plurality of effective sensing areas. The pressure detection sensor may be provided in the ineffective sensing area.

In some exemplary embodiments, each of the plurality of unit sensing areas may have a tetragonal shape. The plurality of effective sensing areas may be located at corners of each unit sensing area.

In some exemplary embodiments, the optical system may comprise a plurality of optical fibers disposed to correspond to the plurality of light detection sensors.

In some exemplary embodiments, the light detection sensor may comprise a photosensitive transistor.

According to some exemplary embodiments of the present invention, a display device may comprise: a display unit including a light emitting element that emits light; and a biometric information sensing unit disposed below the display unit, wherein the biometric information sensing unit receives light reflected by a biometric input. The biometric information sensing unit may comprise: a base substrate including a sensing area and a non-sensing area that surrounds the sensing area; an optical system in the sensing area, wherein the optical system receives the reflected light; a light detection sensor disposed in the sensing area of the base substrate and below the optical system, wherein the light detection sensor receives the reflected light from the optical system; a cushion layer disposed in the non-sensing area, wherein the cushion layer absorbs external pressure;

and a pressure detection sensor disposed in the non-sensing area of the base substrate and below the cushion layer, wherein the pressure detection sensor detects the pressure transferred from the cushion layer.

In some exemplary embodiments, the pressure detection sensor may comprise a plurality of strain detection patterns.

In some exemplary embodiments, the optical system may comprise a plurality of optical fibers arranged in the sensing area. The cushion layer may be adjacent to the plurality of optical fibers and disposed in the non-sensing area.

In some exemplary embodiments, the light detection sensor may comprise a photosensitive transistor.

DETAILED DESCRIPTION OF THE EMBODIMENTS

Herein, it will be understood that when a certain component (or region, layer, portion, element, etc.) is referred to as being "on", "connected to", or "coupled to" other component(s), the certain component may be directly disposed on, directly connected to, or directly coupled to the other component(s) or at least one intervening component may be present therebetween.

Like numerals may indicate like components throughout this specification. Moreover, in the figures, thicknesses of layers, films or regions may be exaggerated for clarity.

As used herein, the singular forms, "a", "an" and "the" are intended to include the plural forms as well, unless the context clearly indicates otherwise.

Hereinafter, exemplary embodiments of the present invention will be explained in detail with reference to the accompanying drawings.

Figure 1A:
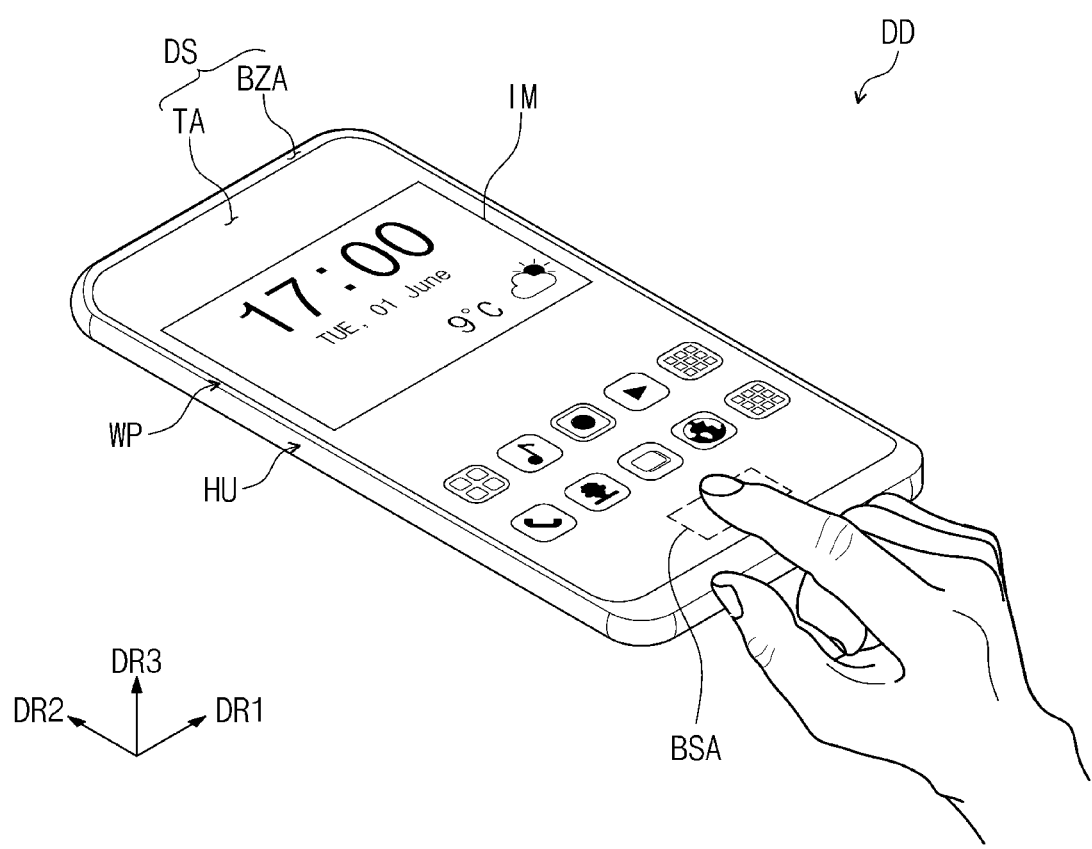
FIG. 1A illustrates a perspective view showing a display device according to some exemplary embodiments of the present invention.
Figure 1B:
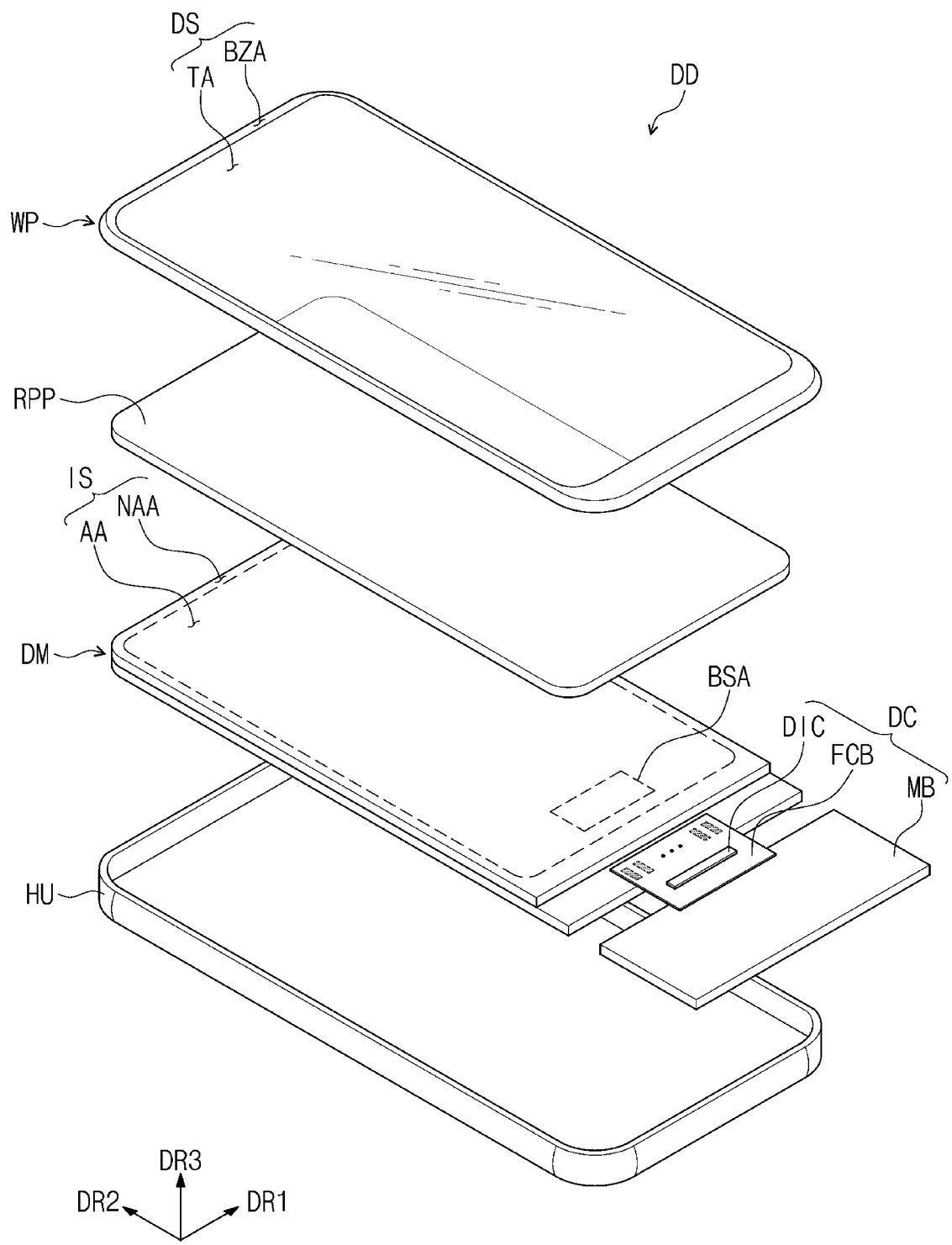
FIG. 1B illustrates an exploded perspective view showing a display device according to some exemplary embodiments of the present invention.
Figure 2:
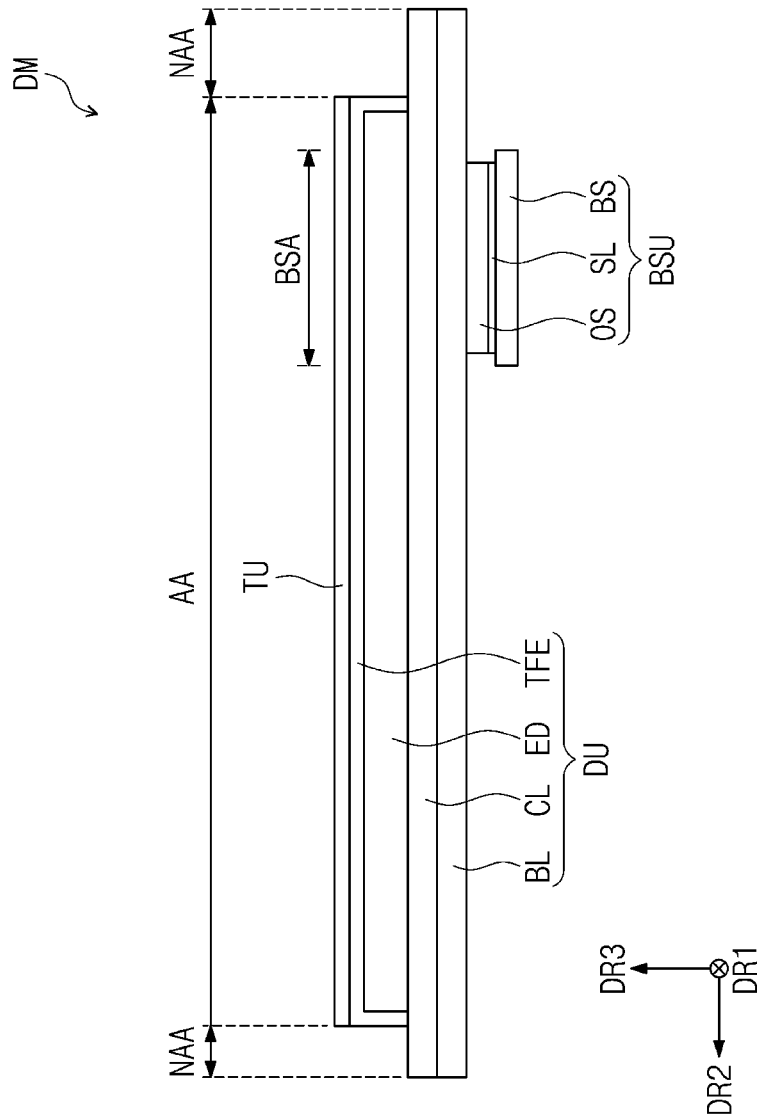
FIG. 2 illustrates a simplified cross-sectional view showing a display module according to some exemplary embodiments of the present invention.
Figure 3:
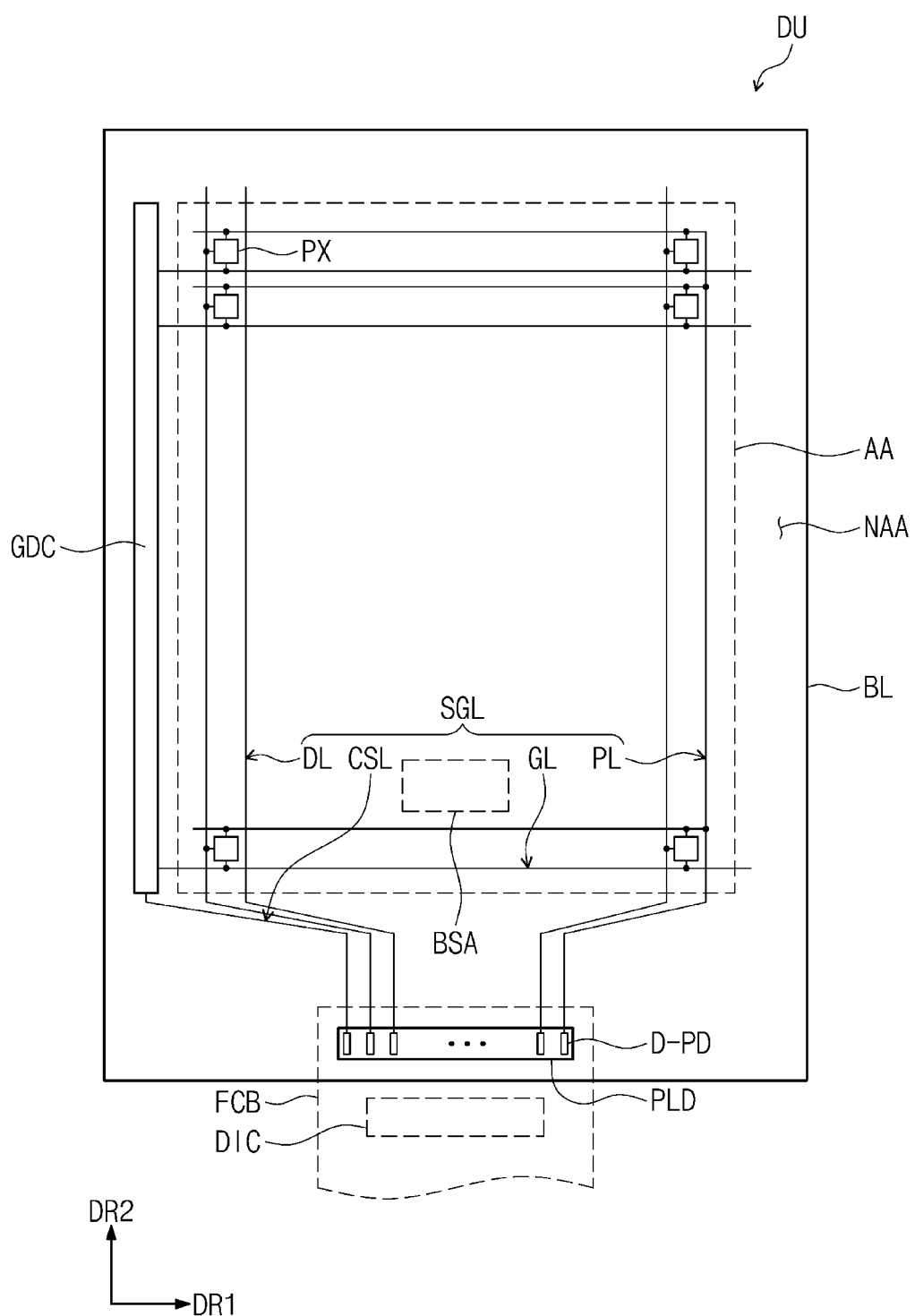
FIG. 3 illustrates a plan view showing a display unit according to some exemplary embodiments of the present invention.

FIG. 1A illustrates a perspective view showing a display device according to some exemplary embodiments of the present invention. FIG. 1B illustrates an exploded perspective view showing a display device according to some exemplary embodiments of the present invention. FIG. 2 illustrates a simplified cross-sectional view showing a display module according to some exemplary embodiments of the present invention. FIG. 3 illustrates a plan view showing a display unit according to some exemplary embodiments of the present invention.

Referring to FIGS. 1A and 1B, a display device DD may be an apparatus that is activated by electrical signals. The display device DD may include various examples. For example, the display device DD may be used for large-sized electronic apparatus, such as televisions, monitors, or outdoor billboards, and may also be used for small- and medium-sized electronic apparatus, such as personal computers, laptop computers, personal digital terminals, automobile navigation units, game consoles, portable electronic devices, or cameras. However, these items are merely exemplary embodiments, and the display device DD may be used for any suitable electronic apparatus that is consistent with the scope and spirit of the present invention. In some exemplary embodiments of the present invention, a smart phone is illustrated as an example of the display device DD.

The display device DD may display an image IM in a third direction DR3 on a display surface DS parallel to each of a first direction DR1 and a second direction DR2. The image IM may include not only dynamic images but also static images. FIG. 1A shows a clock window and icons as an example of the image IM. The display surface DS, on which the image IM is displayed, may correspond to a front (or top) surface of the display device DD and also to a front surface of a window WP.

In some exemplary embodiments of the present invention, front and rear surfaces (or top and bottom surfaces) of each component may be defined based on a direction along which the image IM is displayed. The front and rear surfaces may be opposite to each other in the third direction DR3, and a normal direction to each of the front and rear surfaces may be parallel to the third direction DR3. Directions indicated by the first, second, and third directions DR1, DR2, and DR3 are relative and may be changed into other directions. Herein, the phrase "when viewed on a plane" may mean "when viewed in the third direction DR3".

According to some exemplary embodiments of the present invention, the display device DD may detect a user's input that is externally applied. The user's input may include a user's body, light, heat, pressure, or any other suitable types of inputs. The user's input may be a combination of input thereof. In some exemplary embodiments, depending on a structure of the display device DD, the display device DD may detect a user's input that is applied to a lateral or rear surface of the display device DD, but the present invention is not limited thereto.

The display device DD may detect a user's biometric authentication information that is externally applied. A biometric information sensing area BSA may be provided on the display surface DS of the display device DD. The biometric information sensing area BSA may be provided in all or a portion of a transmission area TA. For example, FIGS. 1A and 1B show that the biometric information sensing area BSA is provided on a portion of the transmission area TA, but the present invention is not limited thereto. In one exemplary embodiment of the present invention, the entirety of the transmission area TA may be used as the biometric information sensing area BSA.

Referring to FIG. 1B, the display device DD may include a window WP, an antireflection panel RPP, a display module DM, and a housing HU. In some embodiments, the window WP and the housing HU may be combined with each other to constitute the display device DD.

The window WP may include an optically transparent dielectric material. For example, the window WP may include glass or plastic. The window WP may have a single-layered structure or a multi-layered structure. For example, the window WP may include either a plurality of plastic films that are coupled together through an adhesive, or a glass substrate and a plastic film that are coupled together through an adhesive.

As discussed above, the front surface of the window WP may form the front surface of the display device DD. The transmission area TA may be an optically transparent region. For example, the transmission area TA may be a region having a visible light transmittance equal to or greater than about 90%.

A bezel area BZA may be a region where transmittance is relatively less than that of the transmission area TA. The bezel area BZA may demonstrate the transmission area TA. The bezel area BZA may be adjacent to, and may surround, the transmission area TA.

The bezel area BZA may have a certain color. The bezel area BZA may cover a peripheral area NAA of the display module DM, and may prevent the peripheral area NAA from being externally recognized. However, exemplary embodiments of the present invention are not limited thereto, and the bezel area BZA may be omitted from the window WP. For example, when omitted, the transmission area TA may take up the entire front surface of the window WP.

The antireflection panel RPP may be disposed below the window WP. The antireflection panel RPP may overlap the display module DM. The antireflection panel RPP may reduce a reflectance of external light that is incident from an upper side of the window WP. In some exemplary embodiments of the present invention, the antireflection panel RPP may be omitted or may be a component included in the display module DM.

The display module DM may display the image IM, may sense an external input, and may detect a user's fingerprints. The display module DM may include a front surface IS including an active area AA and a peripheral area NAA. The active area AA may be a region that is activated by electric signals.

In some exemplary embodiments of the present invention, the active area AA may be a region that displays the image IM and also detects an external input (e.g., from a user). The transmission area TA may overlap at least the active area AA. For example, the transmission area TA may entirely or at least partially overlap the active area AA. Accordingly, a user may recognize the image IM through the transmission area TA or may provide an external input through the transmission area TA. However, the present invention is not limited thereto. The active area AA may be configured such that a region for displaying the image IM is separated from a region for detecting an external input.

The peripheral area NAA may be a region covered with the bezel area BZA. For example, the peripheral area NAA may be entirely covered by the bezel area BZA and prevented from being externally recognized. The peripheral area NAA may be adjacent to the active area AA. The peripheral area NAA may surround the active area AA. The peripheral area NAA may include a plurality of driver lines or driver circuits to drive the active area AA.

The display device DD further includes a driver circuit module DC. The driver circuit module DC may be electrically connected to the display module DM. The driver circuit module DC may include a main circuit board MB and a flexible circuit board FCB.

The main circuit board MB may include power supply connectors or various driver circuits to drive the display module DM. The flexible circuit board FCB may be coupled to the main circuit board MB and the display module DM. The driver circuit module DC may further include a driver chip DIC mounted on the flexible circuit board FCB. In some exemplary embodiments of the present invention, the driver chip DIC may be directly mounted on the display module DM.

The housing HU may be combined with the window WP. The housing HU and the window WP may be combined with each other to provide an inner space. The display module DM may be accommodated in the inner space. The housing HU may include a material whose rigidity is relatively high. For example, the housing HU may include one selected from glass, plastic, and metal, or may include a plurality of frames and/or a plurality of plates each frame or plate includes any combination of glass, plastic, and metal thereof. The housing HU may stably protect components of the display device DD from external impact when these components are accommodated in the inner space.

The display module DM and the housing HU may be provided therebetween with a battery module or the like to provide power required for an overall operation of the display device DD.

Referring to FIGS. 1B and 2, the display module DM according to some exemplary embodiments of the present invention may include a display unit DU and an input sensing unit TU.

The display unit DU may display an image based on electric signals, and the input sensing unit TU may detect an external input that is externally applied. The external input may include any suitable types of inputs that are applied from outside the display device DD. The external input may be provided in various types. For example, the external input may not only include touch from a user's hand or other body parts, but also include any input (e.g., hovering touch) that approaches or is in the vicinity of the display device DD before making contact. In addition, the external input may include force, pressure, light, or any other external inputs.

The front surface IS of the display module DM may be divided into the active area AA and the peripheral area NAA. The active area AA may be a region that displays an image provided from the display module DM. According to the present embodiments, the biometric information sensing area BSA may be included in the active area AA. For example, the biometric information sensing area BSA may be provided near the peripheral area NAA, and may be surrounded by the active area AA. The biometric information sensing area BSA may refer to a region that detects a user's biometric authentication information. In some exemplary embodiments of the present invention, the biometric information sensing area BSA may detect a user's fingerprints as the biometric authentication information.

Referring to FIG. 2, the display unit DU may include a base layer BL, a display circuit layer CL, a display element layer ED, and an encapsulation layer TFE.

The base layer BL may include a synthetic resin layer. The synthetic resin layer may be formed on a workpiece substrate that is used for fabricating the display unit DU. A conductive layer and a dielectric layer may be formed on the synthetic resin layer. When the workpiece substrate is removed, the synthetic resin layer may correspond to the base layer BL. The synthetic resin layer may be a polyimide-based resin layer, but a material of the synthetic resin layer is not limited thereto. The base layer BL may include one or more of a glass substrate, a metal substrate, and an organic/inorganic composite substrate.

The display circuit layer CL may be disposed on the base layer BL. The display circuit layer CL may include at least one dielectric layer and a circuit element. Hereinafter, the dielectric layer included in the display circuit layer CL may be called an intermediate dielectric layer. The intermediate dielectric layer may include at least one intermediate inorganic layer and at least one intermediate organic layer. The circuit element may include a signal line, a pixel driver circuit, or the like. The display circuit layer CL may be formed by formation processes in which dielectric, semiconductor, and conductive layers are coated or deposited, and by patterning processes in which photolithography is used to pattern the dielectric, semiconductor, and conductive layers.

The display element layer ED may overlap the display circuit layer CL. For example, the display element layer ED may directly contact the display circuit layer CL. The display element layer ED may include an organic light emitting element and a pixel definition layer. The display element layer ED will be further discussed in detail below with reference to FIG. 4A.

The encapsulation layer TFE may encapsulate the display element layer ED. The encapsulation layer TFE may include at least one organic layer and at least one inorganic layer. The inorganic layer may protect the display element layer ED from moisture/oxygen or any other types of external environmental impact. The inorganic layer may include a silicon nitride layer, a silicon oxynitride layer, a silicon oxide layer, a titanium oxide layer, or an aluminum oxide layer, but exemplary embodiments of the present invention are not limited thereto.

Referring to FIG. 3, the display unit DU may include a driver circuit GDC, a plurality of signal lines SGL, and a plurality of pixels PX. The display unit DU may be disposed in the peripheral area NAA, and may further include a pixel pad section PLD including pixel pads D-PD connected to corresponding ones of the plurality of signal lines SGL.

The pixels PX may be disposed in the active area AA. Each of the pixels PX may include an organic light emitting element and a pixel driver circuit connected to the organic light emitting element. The driver circuit GDC, the signal lines SGL, the pixel pad section PLD, and the pixel driver circuit may be included in the display circuit layer CL illustrated in FIG. 2.

The driver circuit GDC may include a gate driver circuit. The gate driver circuit may generate a plurality of gate signals, and may sequentially output the gate signals to a plurality of gate lines GL which will be discussed below. The gate driver circuit may further output different control signals to the pixel driver circuit.

The signal lines SGL may include gate lines GL, data lines DL, a power line PL, and a control signal line CSL. One of the gate lines GL may be connected to a corresponding one of the pixels PX, and one of the data lines DL may be connected to a corresponding one of the pixels PX. The power line PL may be connected to the pixels PX. The control signal line CSL may provide the gate driver circuit with control signals. The signal lines SGL may overlap the active area AA and the peripheral area NAA.

The pixel pad section PLD may be a portion with which the main circuit board MB (as illustrated in FIG. 1B) is joined, and the pixel pads D-PD of the pixel pad section PLD may be connected to corresponding pads of the main circuit board MB. Portions of connection lines disposed on the display circuit layer CL may be exposed by a dielectric layer included in the display circuit layer CL, and the exposed portions may correspond to the pixel pads D-PD.

The pixel pads D-PD may be connected through the signal lines SGL to corresponding pixels PX. In addition, one of the pixel pads D-PD may be connected to the driver circuit GDC.

The pixel PX may receive a gate signal from the gate line GL and a data signal from the data line DL. The pixel PX may also receive a first power voltage from the power line PL. The pixel PX may include a thin film transistor, a capacitor, and an organic light emitting element.

Referring back to FIG. 2, the input sensing unit TU may be directly disposed on the display unit DU. In some exemplary embodiments of the present invention, the input sensing unit TU may be directly placed on the encapsulation layer TFE. For example, the input sensing unit TU and the encapsulation layer TFE may be formed by a continuous process. The input sensing unit TU may be combined with the encapsulation layer TFE through an adhesive member disposed on the encapsulation layer TFE, but the present invention is not limited thereto.

The input sensing unit TU may include sensing electrodes each of which includes a sensing pattern and a sensing line. The sensing electrodes and the sensing lines may each have a single-layered or multi-layered structure.

The display module DM according to some exemplary embodiments of the present invention may further include a biometric information sensing unit BSU. The biometric information sensing unit BSU may be disposed on a bottom surface of the display unit DU, while corresponding to the biometric information sensing area BSA. In other words, the biometric information sensing unit BSU may be formed in the biometric information sensing area BSA. In this description, the biometric information sensing area BSA is illustrated as a portion of the display module DM, but the biometric information sensing area BSA may extend over the entirety of the display module DM. For example, in FIG.

2, a width of the biometric information sensing area BSA in the second direction DR2 may be the same as a width of the display module DM.

In some exemplary embodiments of the present invention, the biometric information sensing unit BSU may include a base substrate BS, a sensing layer SL provided on the base substrate BS, and an optical system OS provided on the sensing layer SL. The sensing layer SL may include a recognition sensor to recognize a user's biometric authentication information (e.g., fingerprints) and a pressure detection sensor to detect pressure applied externally from the user. In some exemplary embodiments of the present invention, the recognition sensor may be a fingerprint sensor to sense the user's fingerprints, a blood sensor to detect blood flow, a pulse sensor to measure heart rate, or the like. As discussed above, the biometric information sensing unit BSU may include the optical system OS, but the present invention is not limited thereto. For example, the biometric information sensing unit BSU may include an ultrasonic transceiver and may thus be used as an ultrasonic sensor in which fingerprints are detected based on an ultrasonic method.

Figure 4A:
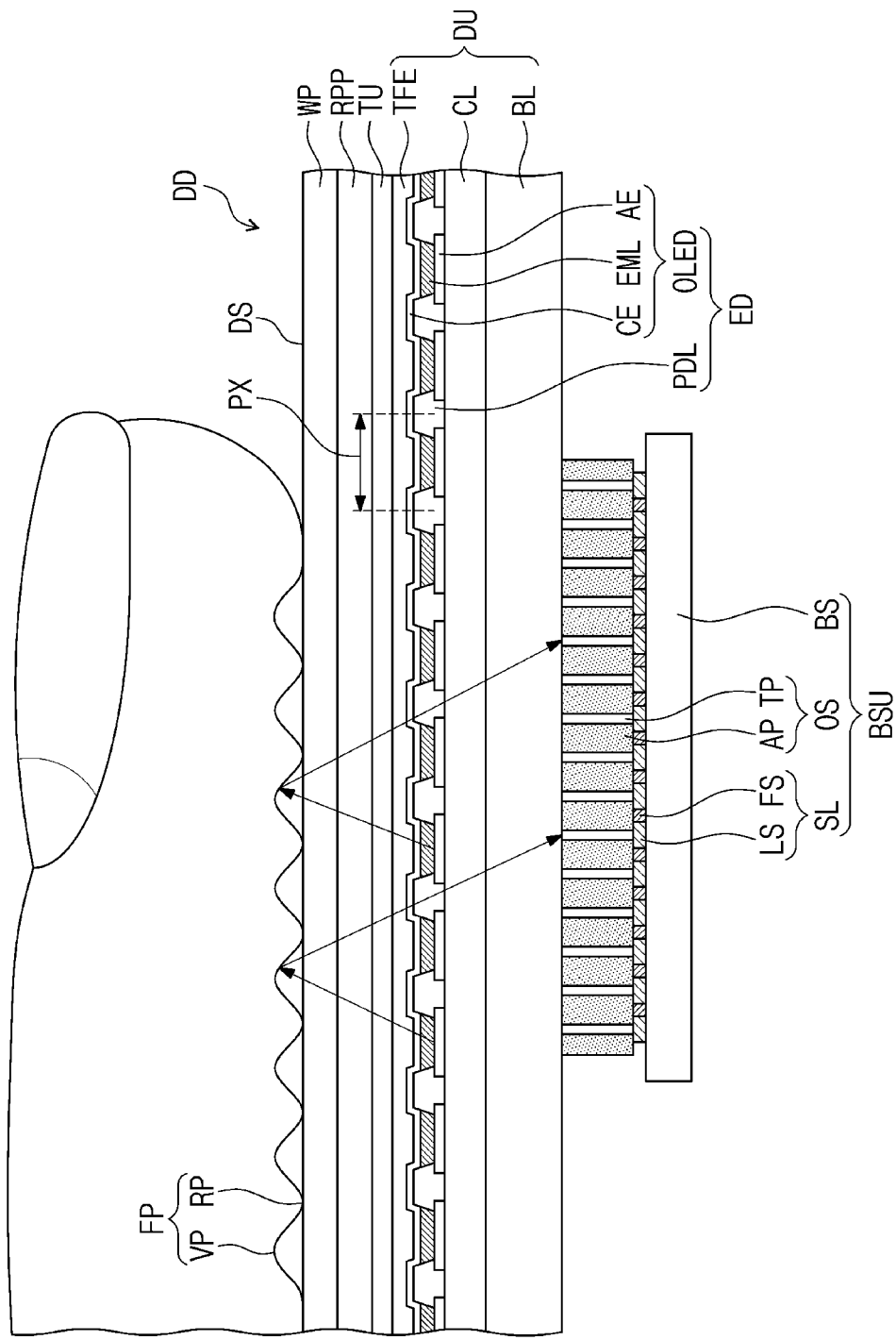
FIG. 4A illustrates an enlarged cross-sectional view showing a biometric information sensing unit according to some exemplary embodiments of the present invention.
Figure 4B:
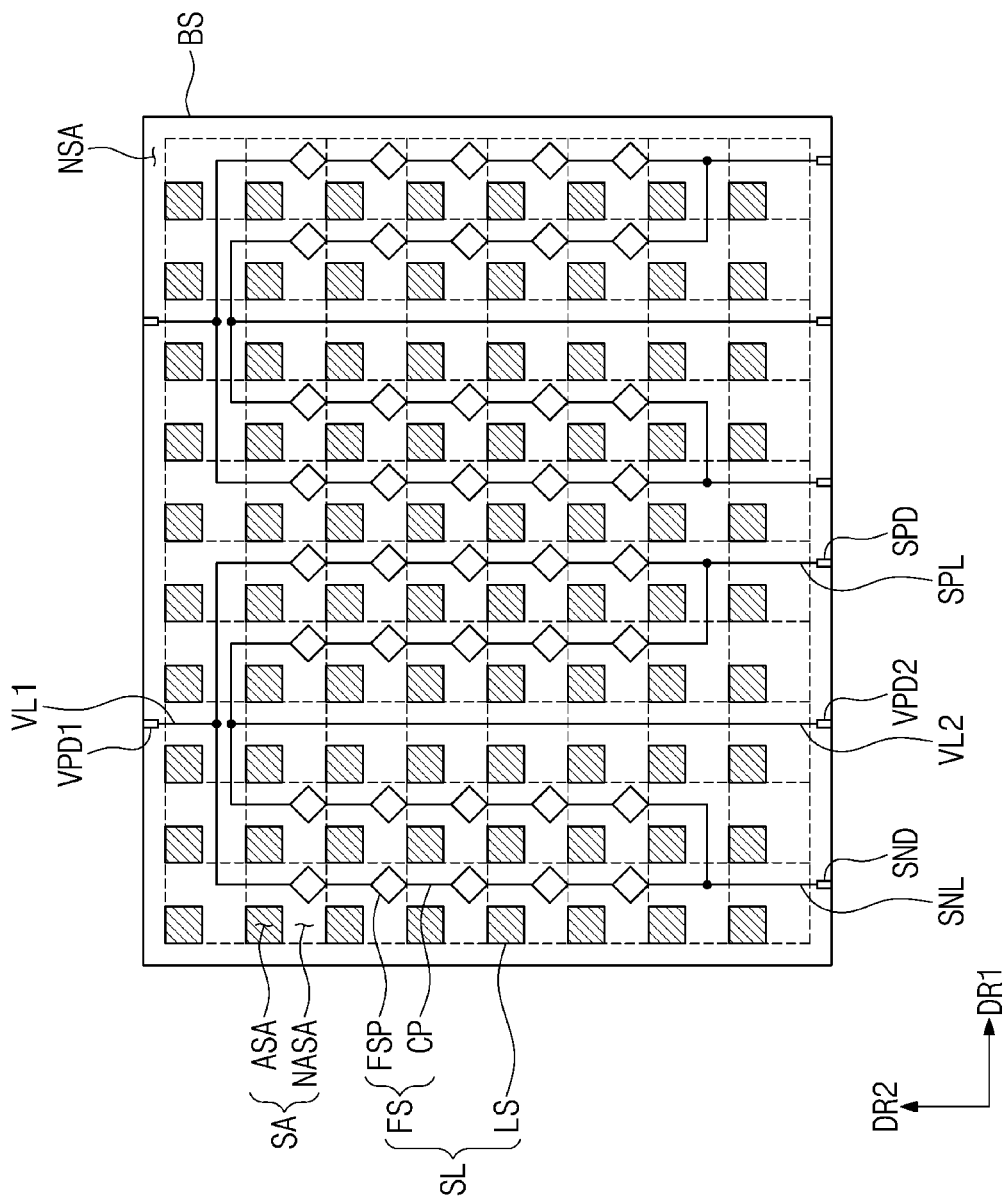
FIG. 4B illustrates a plan view showing a light detection sensor and a pressure detection sensor according to some exemplary embodiments of the present invention.
Figure 4C:
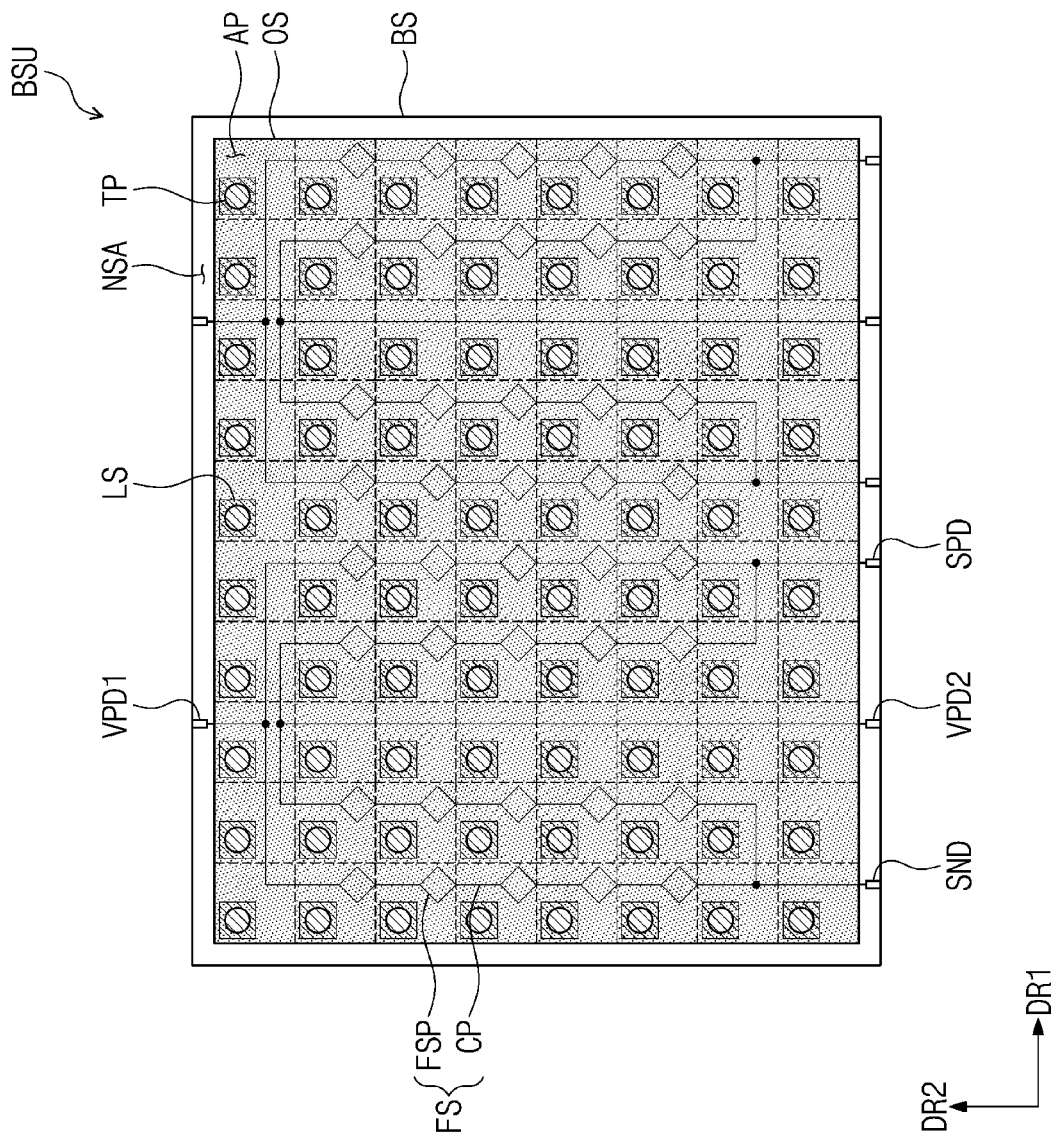
FIG. 4C illustrates a plan view showing an arrangement relationship between an optical system, a light detection sensor, and a pressure detection sensor according to some exemplary embodiments of the present invention.

FIG. 4A illustrates an enlarged cross-sectional view showing a biometric information sensing unit BSU according to some exemplary embodiments of the present invention. FIG. 4B illustrates a plan view showing a light detection sensor and a pressure detection sensor according to some exemplary embodiments of the present invention. FIG. 4C illustrates a plan view showing an arrangement relationship among an optical system, a light detection sensor, and a pressure detection sensor according to some exemplary embodiments of the present invention. In the following embodiments illustrated in FIG. 4A, the same components as those shown FIG. 2 are allocated the same reference symbols thereto, and detailed explanations thereof will be omitted.

Referring to FIG. 4A, the display unit DU may include a base layer BL on which are disposed a display circuit layer CL, a display element layer ED, and an encapsulation layer TFE. The display unit DU may further include functional layers such as an antireflection layer and a refractive index adjustment layer.

The display element layer ED may include a pixel definition layer PDL and an organic light emitting diode OLED. The pixel definition layer PDL may include an organic material. A first electrode AE may be disposed on the display circuit layer CL. The pixel definition layer PDL may be formed on the first electrode AE. An opening may be provided in the pixel definition layer PDL. The opening of the pixel definition layer PDL may expose at least a portion of the first electrode AE. In some exemplary embodiments of the present invention, the pixel definition layer PDL may be omitted.

An emission layer EML may be disposed in a region that corresponds to the opening. For example, the emission layer EML may be formed in each of the pixels PX. The emission layer EML may include an organic material and/or an inorganic material. The emission layer EML may generate a certain colored light. For example, the emission layer EML may generate a red light, a green light, a blue light, or any combination of light thereof.

In some exemplary embodiments of the present invention, the emission layer EML is patterned for every pixel PX, but the present invention is not limited thereto. A second electrode CE may be disposed on the emission layer EML. The second electrode CE may be placed in common on the pixels PX. The encapsulation layer TFE may be disposed on the second electrode CE.

The biometric information sensing unit BSU may be provided below the display unit DU and receive light output from the display unit DU to recognize biometric authentication information. For example, the biometric information sensing unit BSU may receive light reflected from a user's finger to recognize his or her biometric information.

More specifically, when the display unit DU operates, the emission layer EML of the display unit DU may emit light including image data and the output light may be displayed as an image on a display surface DS. When a user's finger touches on the display surface DS, the light may be reflected from the finger and then provided to the biometric information sensing unit BSU positioned below the display unit DU.

When a user's fingerprint FP touches the display surface DS, there may be a difference in intensity between a reflected light that is reflected from a ridge RP of the fingerprint FP and a reflected light that is reflected from a valley VP of the fingerprint FP. The biometric information sensing unit BSU may use the difference to recognize the fingerprint FP.

The biometric information sensing unit BSU may include a base substrate BS, a sensing layer SL, and an optical system OS, and the sensing layer SL may include a light detection sensor LS and a pressure detection sensor FS.

The optical system OS may include a transmission part TP that is transparent to light incident on the biometric information sensing unit BSU, and may also include an absorption part AP that is provided around the transmission part TP and absorbs the light. The optical system OS may include a collimator layer to allow the light detection sensor LS to condense light reflected from the finger. The collimator layer may have a structure in which a plurality of openings are formed or a plurality of slits are formed, and for example, the plurality of openings or slits may transmit only light whose incident angle falls within a certain range. The angle range may be changed based on a width of each of the plurality of openings or slits. Herein, the plurality of openings or slits may be referred to as the transmission part TP of the optical system OS. For example, the transmission part TP may be a pinhole.

The absorption part AP may have a property to absorb light. The absorption part AP may be a colored layer. For example, the absorption part AP may include a material in which light-absorbing particles are distributed. Additionally or alternatively, the absorption part AP may be a layer in which a carbon-based pigment is mixed.

The light detection sensor LS may be disposed below the transmission part TP of the optical system OS, and may receive light that passes through the transmission part TP. For example, the optical system OS may prevent the light detection sensor LS from receiving light other than light that is incident after being reflected from the user's finger.

In some exemplary embodiments of the present invention, the pressure detection sensor FS may be disposed below the absorption part AP of the optical system OS. Therefore, externally applied pressure may be transferred through the absorption part AP to the pressure detection sensor FS.

Referring to FIGS. 4B and 4C, the base substrate BS of the biometric information sensing unit BSU may include a sensing area SA and a non-sensing area NSA. The non-sensing area NSA may be provided to surround the sensing area SA. The sensing layer SL may be disposed in the sensing area SA of the base substrate BS. The sensing layer SL may include the light detection sensor LS and the pressure detection sensor FS. The light detection sensor LS and the pressure detection sensor FS may be disposed in the sensing area SA.

The sensing area SA may include a plurality of sensing regions that are arranged in a matrix shape, and each of the plurality of sensing regions may include an effective sensing area ASA and an ineffective sensing area NASA. The light detection sensor LS may be disposed in the effective sensing area ASA, and the pressure detection sensor FS may be disposed in the ineffective sensing area NASA. The effective sensing area ASA may overlap the transmission part TP of the optical system OS. For example, the transmission part TP of the optical system OS may be positioned in the effective sensing area ASA.

In some exemplary embodiments of the present invention, the light detection sensor LS may include a plurality of photosensitive transistors that are arranged in a matrix shape in the sensing area SA. A region where the plurality of photosensitive transistors is disposed may be referred to as the effective sensing area ASA. The plurality of photosensitive transistors may receive light provided from the transmission part TP, and may output current that corresponds to intensity of the incident light.

The pressure detection sensor FS may include a plurality of strain detection patterns FSP disposed in the ineffective sensing area NASA and a connection pattern CP that connects the plurality of strain detection patterns FSP to each other. The plurality of strain detection patterns FSP may each include a strain gauge.

As shown in FIG. 4B, the pressure detection sensor FS may include two pressure detection strings. The two pressure detection strings may be disposed adjacent to each other in the first direction DR1. Each of the pressure detection strings may include a plurality of strain detection patterns FSP and a connection pattern CP. The present invention, however, is not limited thereto. For example, the pressure detection sensor FS may include at least one pressure detection string, or three or more pressure detection strings. The pressure detection strings may have the same structure. The pressure detection strings may be formed in columns in the second direction DR2.

The pressure detection sensor FS may be disposed spaced apart from the light detection sensor LS. For example, a column of pressure detection sensors FS may be formed between adjacent columns of the light detection sensors LS. In addition, the plurality of strain detection patterns FSP and the connection pattern CP may not overlap the photosensitive transistors. The plurality of strain detection patterns FSP may overlap the absorption part AP.

Each of the plurality of strain detection patterns FSP may have a rhombic shape. An empty space may be formed in a central region of the rhombic shape. However, the shapes of the plurality of strain detection patterns FSP are not limited thereto. For example, each of the plurality of strain detection patterns FSP may have a circular shape, a tetragonal shape, an oval shape, or the like.

The plurality of strain detection patterns FSP may be arranged spaced apart from each other in the second direction DR2, and may be connected to each other through the connection pattern CP.

The pressure detection sensor FS may further include a first voltage line VL1 connected to one end of each pressure detection string, a second voltage line VL2 connected to another end of each pressure detection string, a first strain line SNL connected to an input end of each pressure detection string, and a second strain line SPL connected to an output end of each pressure detection string.

The first voltage line VL1 may be supplied with a driver voltage, and the second voltage line VL2 may be supplied with a ground voltage. The first strain line SNL may be input with a driver signal, and the second strain line SPL may output a resistance difference measured by pressure.

Pads VPD1, VPD2, SND, and SPD may be disposed in the non-sensing area NSA of the base substrate BS. The pads VPD1, VPD2, SND, and SPD may include a first voltage pad VPD1, a second voltage pad VPD2, a first strain pad SND, and a second strain pad SPD. In some exemplary embodiments of the present invention, the first voltage pad VPD1 may be connected to the first voltage line VL, and the second voltage pad VPD2 may be connected to the second voltage line VL2. The first strain pad SND may be connected to the first strain line SNL, and the second strain pad SPD may be connected to the second strain line SPL.

Accordingly, the pressure detection sensor FS may be externally supplied with the driver voltage, the ground voltage, and the driver signal, and may output the resistance difference measured by pressure.

When the pressure detection sensor FS detects the resistance difference measured by pressure, the biometric information sensing unit BSU may detect a user's touch event to initiate an operation of the light detection sensor LS for fingerprint recognition.

Because the biometric information sensing unit BSU includes the pressure detection sensor FS together with the light detection sensor LS, the biometric information sensing unit BSU may detect the user's touch event and may reduce a time required for initiating the operation of the light detection sensor LS. For example, since the pressure detection sensor FS is provided together with the light detection sensor LS, it may be possible to reduce a standby time of the light detection sensor LS.

Figure 4D:
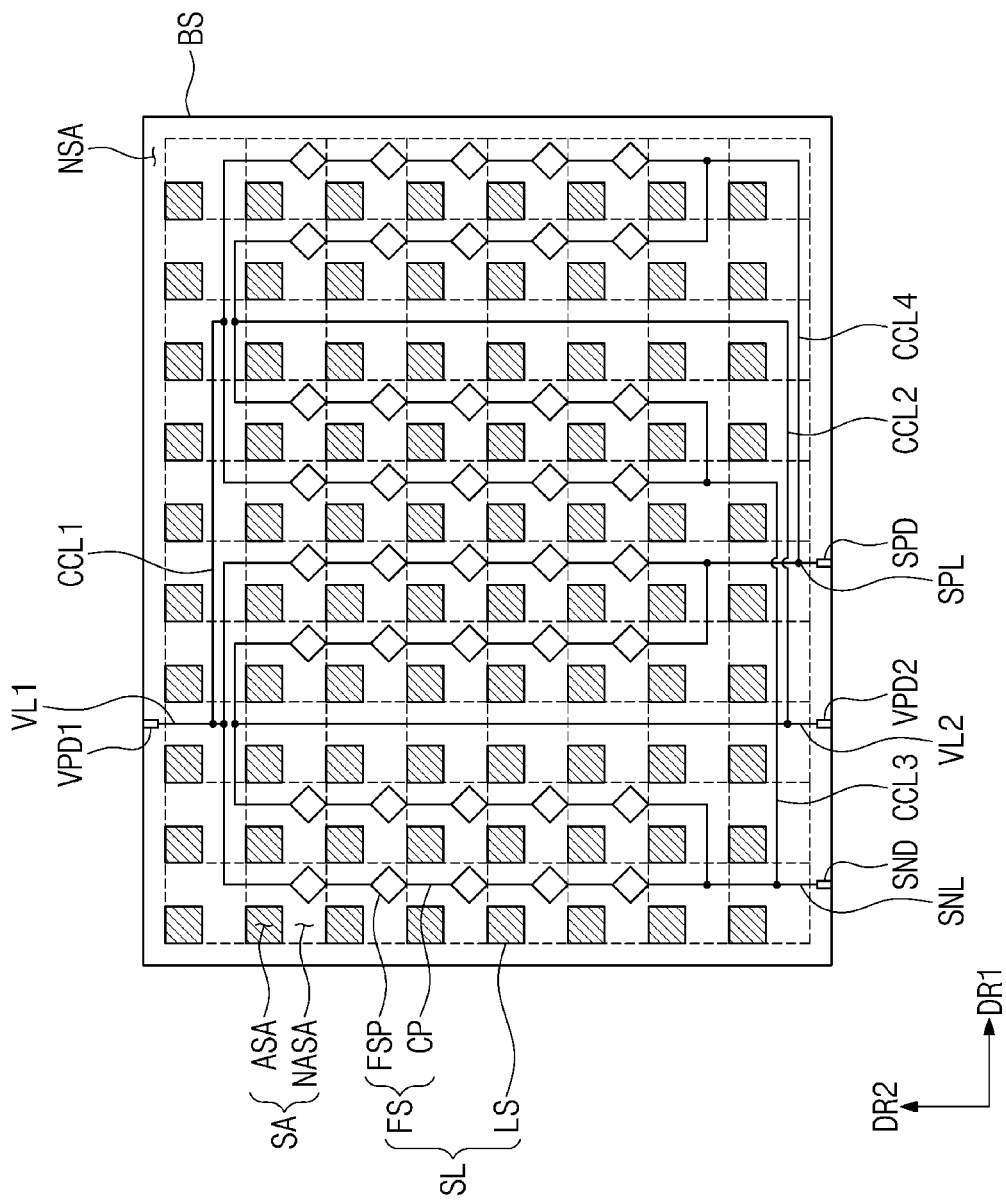
FIG. 4D illustrates a plan view showing a light detection sensor and a pressure detection sensor according to some exemplary embodiments of the present invention.

FIG. 4D illustrates a plan view showing a light detection sensor and a pressure detection sensor according to some exemplary embodiments of the present invention.

Referring to FIG. 4D, the pressure detection sensor FS may include two pressure detection strings (also referred to as first and second pressure detection strings) that are arranged adjacent to each other in the first direction DR1. The first and second pressure detection strings may be connected to common pads VPD1, VPD2, SND, and SPD. The common pads VPD1, VPD2, SND, and SPD may be disposed in the non-sensing area NSA of the base substrate BS. The common pads VPD1, VPD2, SND, and SPD may include a first voltage pad VPD1, a second voltage pad VPD2, a first strain pad SND, and a second strain pad SPD.

The first voltage pad VPD1 may be connected to a first voltage line VL1 of the first pressure detection string, and the second voltage pad VPD2 may be connected to the second voltage line VL2 of the first pressure detection string. The first voltage line VL1 of the first pressure detection string may be connected to the second pressure detection string through a first connection line CCL1. The second voltage line VL2 of the first pressure detection string may be connected to the second pressure detection string through a second connection line CCL2. Accordingly, the first and second pressure detection strings may share one first voltage pad VPD1 and may also share one second voltage pad VPD2.

The first strain pad SND may be connected to a first strain line SNL, and the second strain pad SPD may be connected to a second strain line SPL. The first strain line SNL of the first pressure detection string may be connected through a third connection line CCL3 to the second pressure detection string. The second strain line SNL of the first pressure detection string may be connected through a fourth connection line CCL4 to the second pressure detection string. Accordingly, the first and second pressure detection strings may share one first strain pad SND and may also share one second strain pad SPD.

Figure 5A:
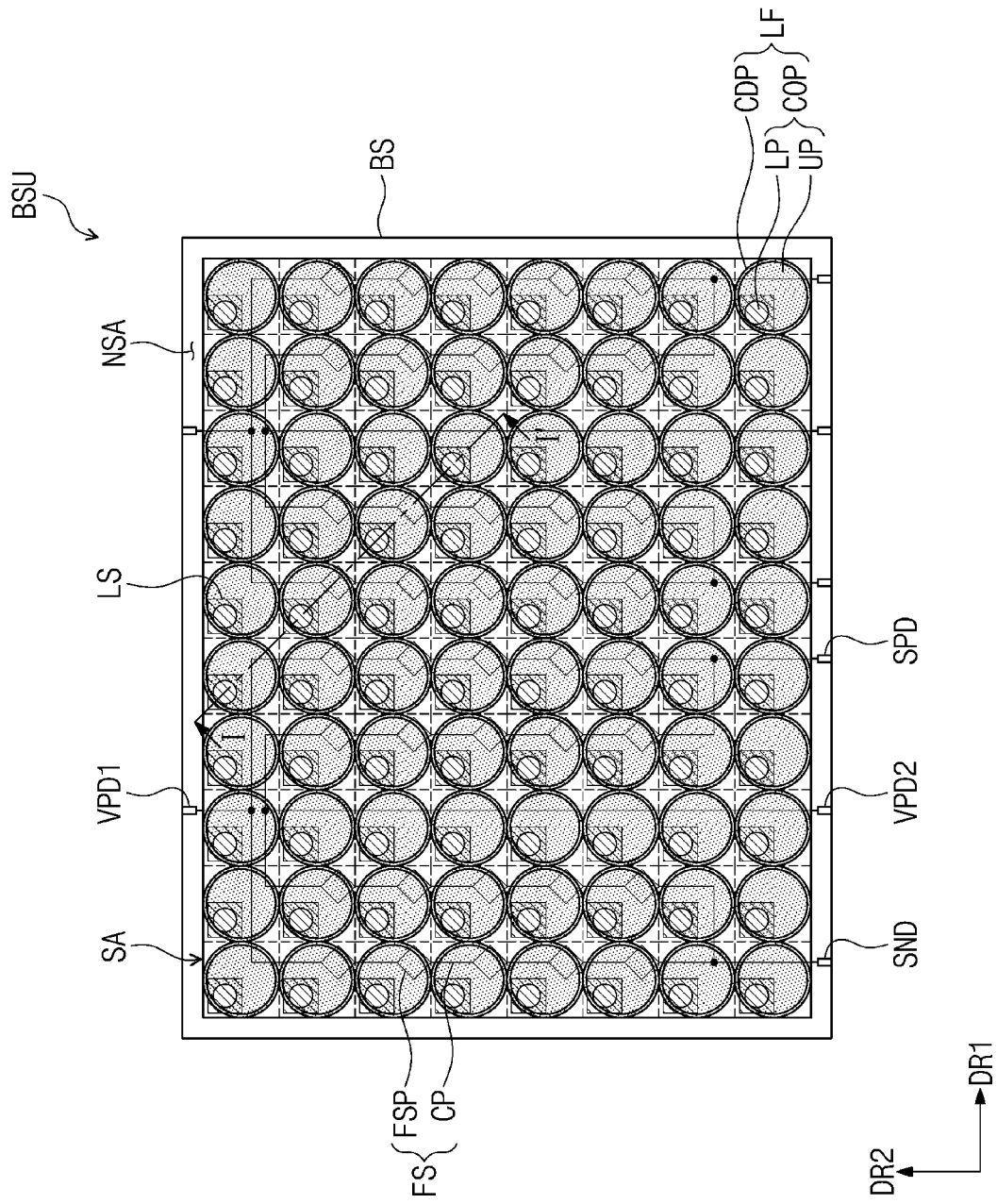
FIG. 5A illustrates a plan view showing an arrangement relationship between an optical system, a light detection sensor, and a pressure detection sensor according to some exemplary embodiments of the present invention.
Figure 5B:
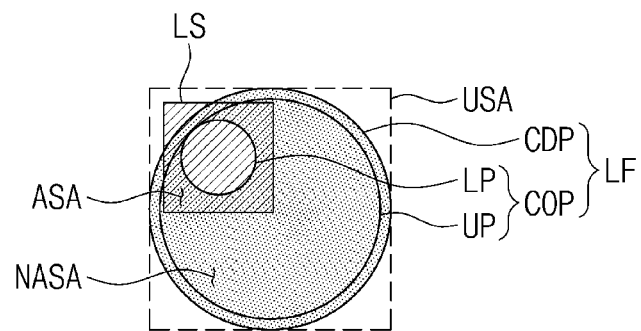
FIG. 5B illustrates an enlarged plan view showing a unit sensing area of FIG. 5A.
Figure 5C:
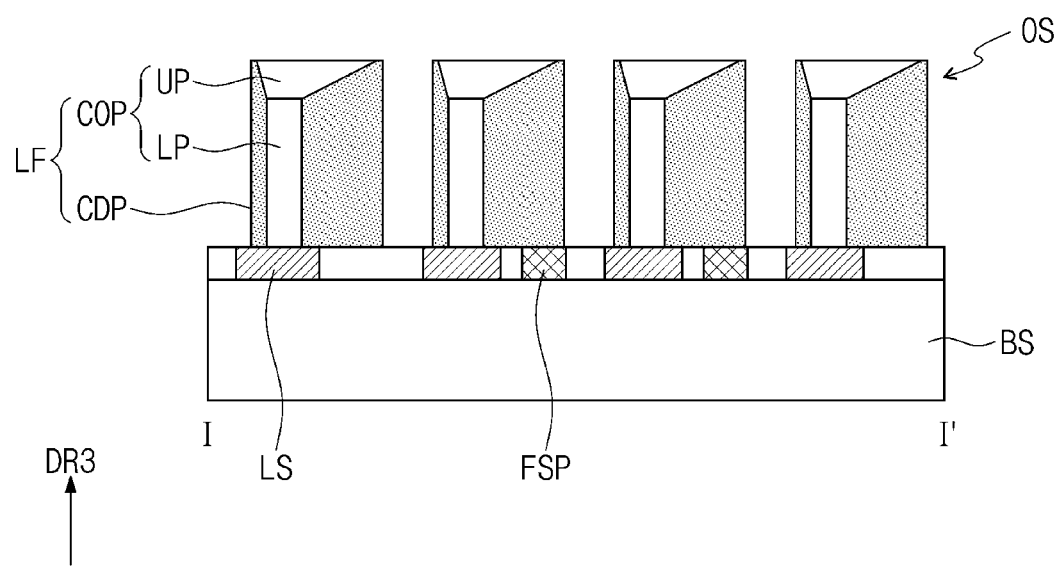
FIG. 5C illustrates a cross-sectional view taken along line I-I' of FIG. 5A.
Figure 5D:
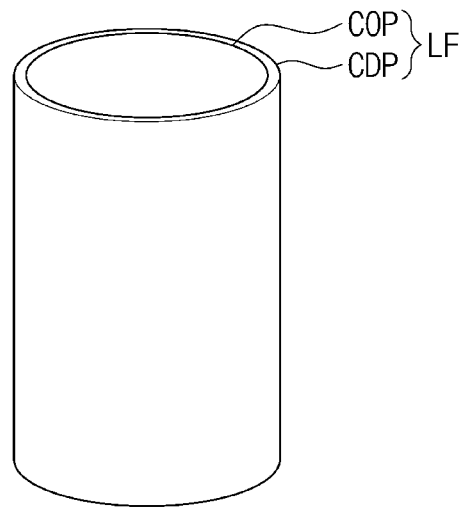
FIG. 5D illustrates a perspective view showing one of a plurality of optical fibers shown in FIG. 5C.
Figure 5E:
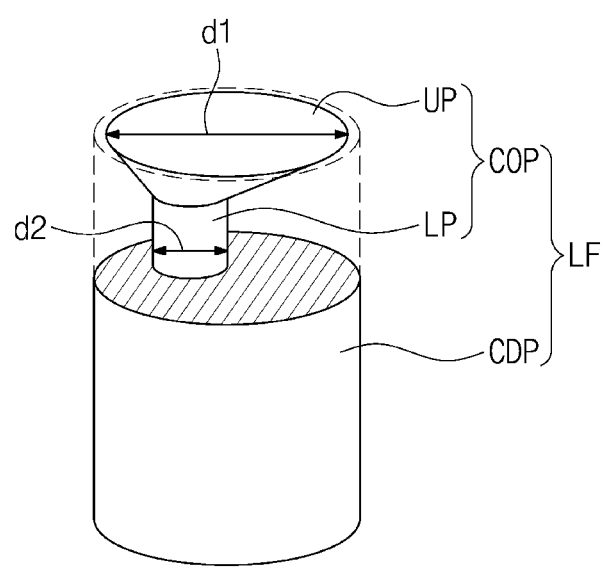
FIG. 5E illustrates a partially exploded perspective view showing the optical fiber shown in FIG. 5D.

FIG. 5A illustrates a plan view showing an arrangement relationship between an optical system, a light detection sensor, and a pressure detection sensor according to some exemplary embodiments of the present invention. FIG. 5B illustrates an enlarged plan view showing a unit sensing area of FIG. 5A. FIG. 5C illustrates a cross-sectional view taken along line I-I' of FIG. 5A. FIG. 5D illustrates a perspective view showing one of a plurality of optical fibers shown in FIG. 5C. FIG. 5E illustrates a partially exploded perspective view showing the optical fiber shown in FIG. 5D. In the following embodiments illustrated in FIG. 5A, the same components as those shown in FIG. 4C are allocated the same reference symbols, and detailed explanations thereof will be omitted.

Referring to FIGS. 5A to 5E, the sensing area SA may include a plurality of unit sensing areas USA, and each of the plurality of unit sensing areas USA may include an effective sensing area ASA and an ineffective sensing area NASA (as illustrated in FIG. 5B).

The optical system OS according to some exemplary embodiments of the present invention may include a plurality of optical fibers LF. The plurality of optical fibers LF may be arranged in a matrix shape along the first and second directions DR1 and DR2. In some exemplary embodiments, the plurality of optical fibers LF may correspond to the plurality of unit sensing areas USA. For example, one optical fiber LF may be disposed on one unit sensing area USA.

The light detection sensor LS may be disposed in the effective sensing area ASA, and the pressure detection sensor FS may be disposed in the ineffective sensing area NASA. For example, the light detection sensor LS may be disposed in the effective sensing area ASA of each unit sensing area USA, and the pressure detection sensor FS may be disposed in the ineffective sensing area NASA of at least some of the unit sensing areas USA.

In some exemplary embodiments of the present invention, the unit sensing area USA may have a tetragonal shape, and the light detection sensor LS may be disposed adjacent to one of four corners of the unit sensing area USA. For example, a center of the unit sensing area USA may be located on a different position from that of a center of the light detection sensor LS.

Each of the plurality of optical fibers LF may include a core part COP and a cladding part CDP provided to surround the core part COP. The core part COP may serve as the transmission part (see TP of FIG. 4A) that transmits light that is incident from the display unit DU, and the cladding part CDP may serve as the absorption part (see AP of FIG. 4A) that absorbs the incident light.

The core part COP may include an upper portion UP having a first diameter d1 and a lower portion LP having a second diameter d2 less than the first diameter d1. The lower portion LP may be a portion that is closer than the upper portion UP to the light detection sensor LS.

The upper portion UP may be provided to overlap the effective and ineffective sensing areas ASA and NASA of the unit sensing area USA. For example, because the first diameter d1 of the upper portion UP is formed greater than the second diameter d2 of the lower portion LP, it is possible to increase efficiency that provides the core part COP with light incident from the display unit DU. The first diameter d1 of the upper portion UP may decrease as approaching the lower portion LP. Therefore, when each optical fiber LF is cut along the third direction DR3, the upper portion UP may have a funnel-shaped cross-section.

The lower portion LP may be disposed in the effective sensing area ASA, thereby overlapping the light detection sensor LS. The lower portion LP may guide light, which is incident through the upper portion UP, to the light detection sensor LS. The lower portion LP may be disposed adjacent to one of four corners of the unit sensing area USA. Therefore, when each optical fiber LF is cut along the third direction DR3, the upper portion UP may have an asymmetrically funnel-shaped cross-section.

The pressure detection sensor FS may be disposed in the ineffective sensing area NASA. In the ineffective sensing area NASA, the pressure detection sensor FS may overlap the cladding part CDP. For example, the pressure detection sensor FS may be disposed below the cladding part CDP. Accordingly, externally applied pressure may be transferred through the cladding part CDP to the pressure detection sensor FS.

The pressure detection sensor FS may have the same structure as that of the pressure detection sensor FS illustrated in FIG. 4B. Therefore, omission will be made to avoid duplicate descriptions of the pressure detection sensor FS.

Because the biometric information sensing unit BSU includes the light detection sensor LS together with the pressure detection sensor FS used for initiating an operation of the light detection sensor LS, the biometric information sensing unit BSU may detect the user's touch event and may reduce a time required for initiating the operation of the light detection sensor LS. For example, because the pressure detection sensor FS is provided together with the light detection sensor LS, it is possible to reduce a standby time of the light detection sensor LS.

Figure 6A:
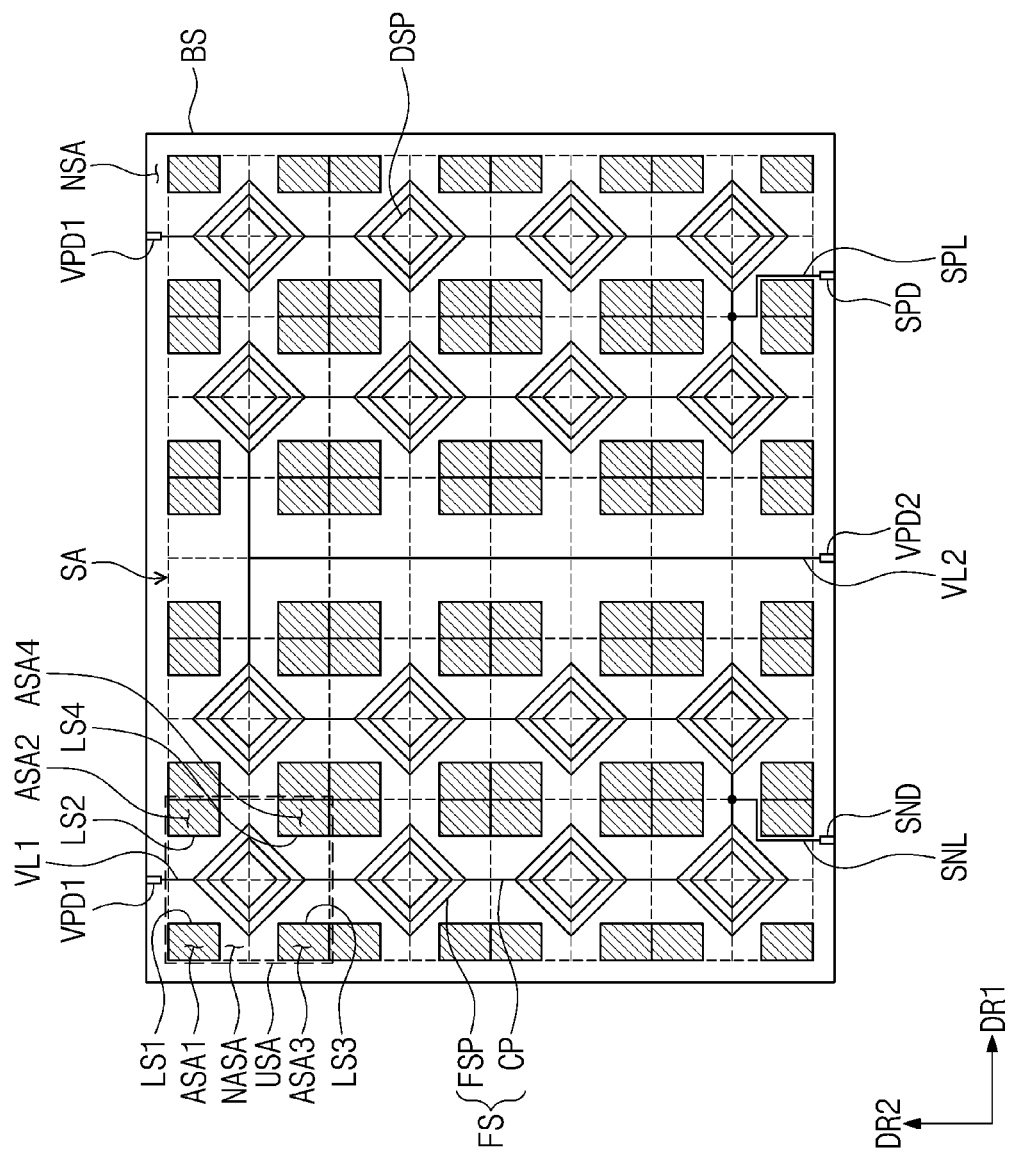
FIG. 6A illustrates a plan view showing a light detection sensor and a pressure detection sensor according to some exemplary embodiments of the present invention.
Figure 6B:
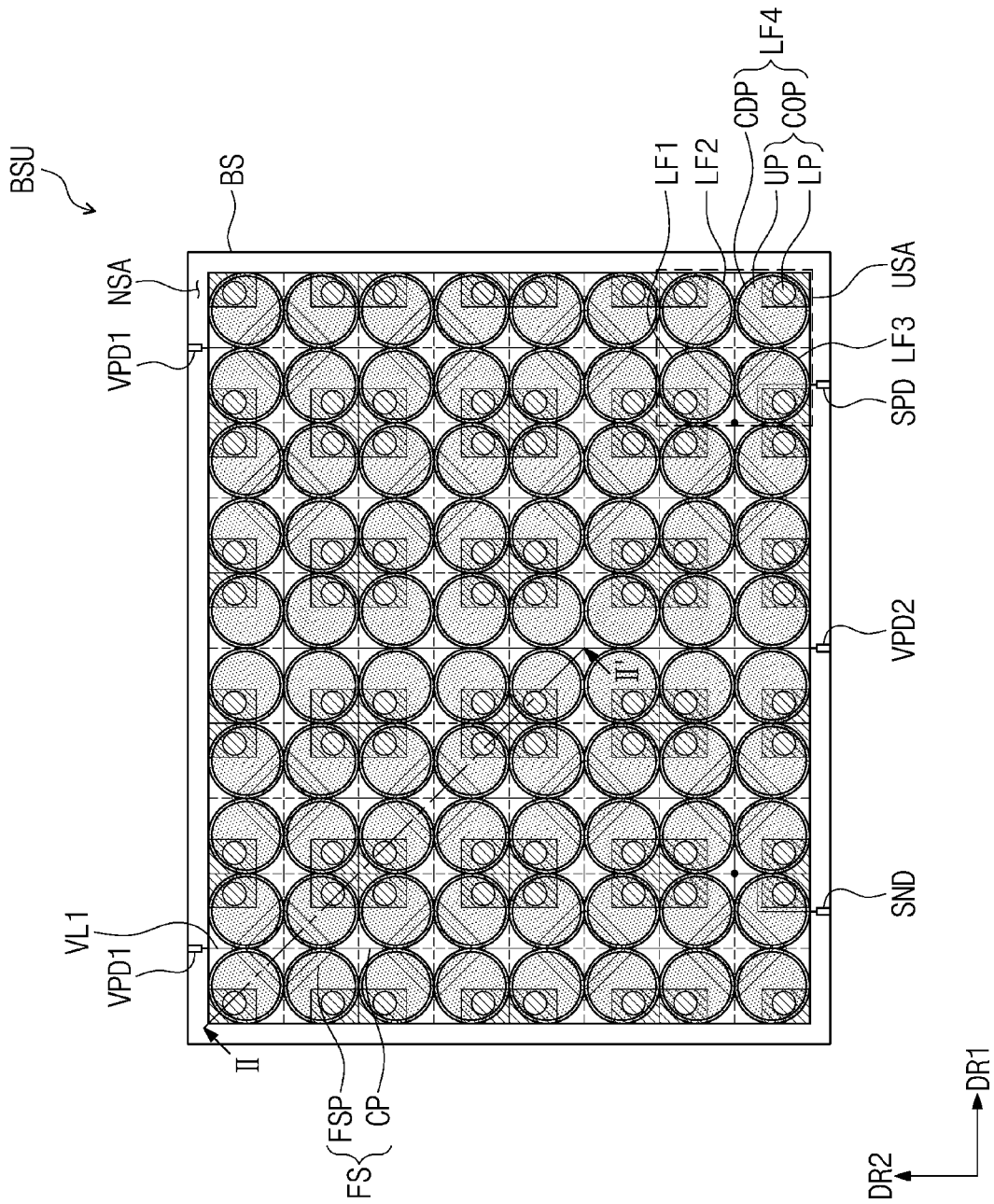
FIG. 6B illustrates a plan view showing an arrangement relationship between an optical system, a light detection sensor, and a pressure detection sensor according to some exemplary embodiments of the present invention.
Figure 6C:
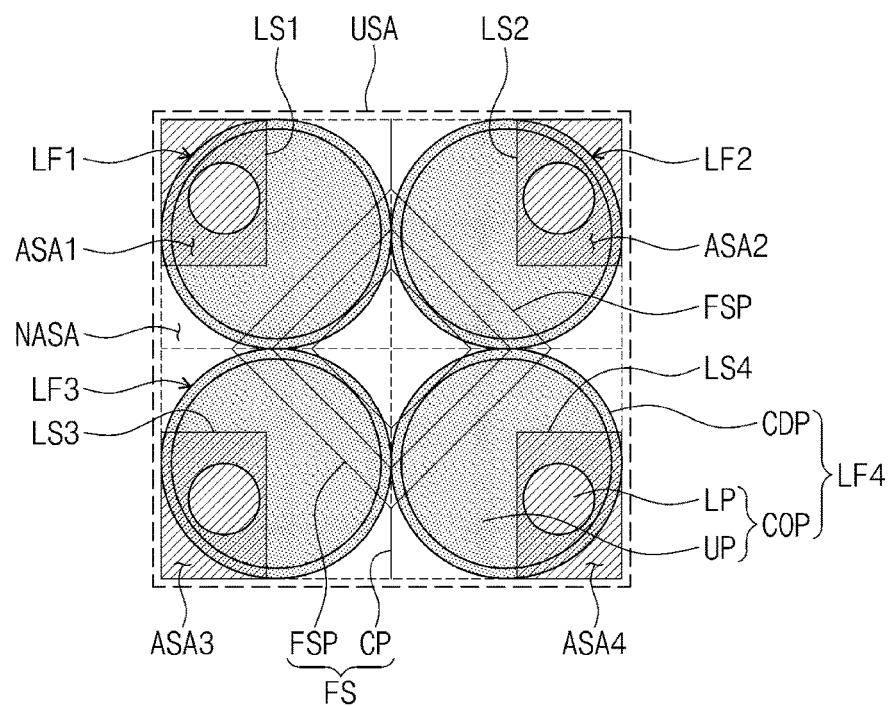
FIG. 6C illustrates an enlarged plan view showing a unit sensing area shown in FIG. 6B.
Figure 6D:
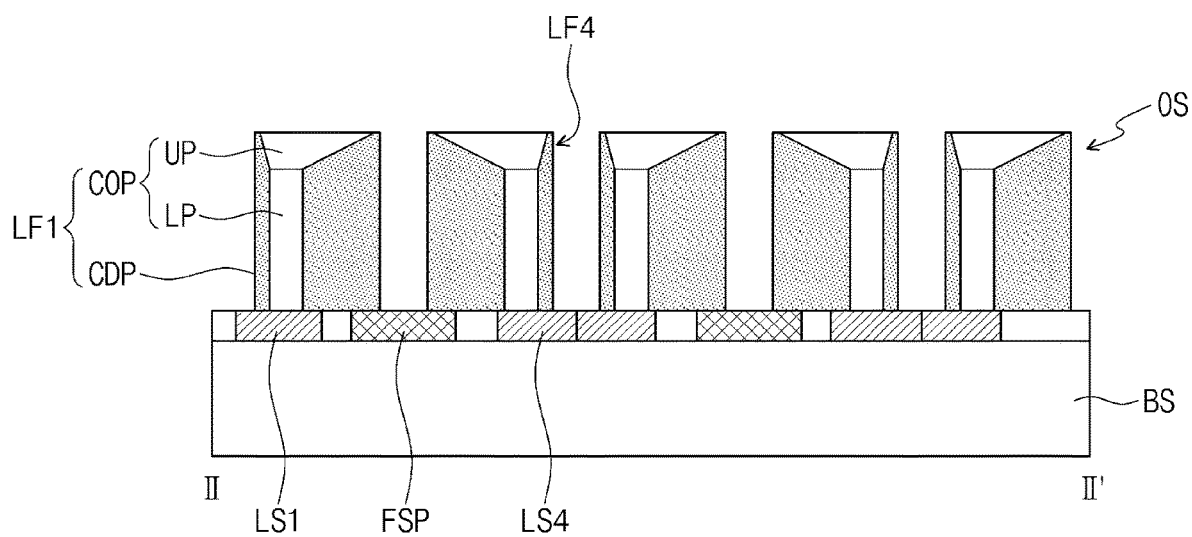
FIG. 6D illustrates a cross-sectional view taken along line II-II' of FIG. 6B.

FIG. 6A illustrates a plan view showing a light detection sensor and a pressure detection sensor according to some exemplary embodiments of the present invention. FIG. 6B illustrates a plan view showing an arrangement relationship between an optical system, a light detection sensor, and a pressure detection sensor according to some exemplary embodiments of the present invention. FIG. 6C illustrates an enlarged plan view showing a unit sensing area depicted in FIG. 6B. FIG. 6D illustrates a cross-sectional view taken along line II-II' of FIG. 6B.

Referring to FIGS. 6A to 6D, the base substrate BS of the biometric information sensing unit BSU may include a sensing area SA and a non-sensing area NSA. The non-sensing area NSA may be provided to surround the sensing area SA.

As illustrated in FIGS. 6A to 6D, the sensing area SA may include a plurality of unit sensing areas USA, and each of the plurality of unit sensing areas USA may include a plurality of effective sensing areas ASA1 to ASA4 (hereinafter referred to as first to fourth effective sensing areas) and an ineffective sensing area NASA. The plurality of unit sensing areas USA may be arranged in a matrix shape along the first and second directions DR1 and DR2.

In some exemplary embodiments of the present invention, each unit sensing area USA may have a tetragonal shape, and may be provided thereon with four light detection sensors LS1, LS2, LS3, and LS4 (hereinafter referred to as first, second, third, and fourth light detection sensors). For example, the first, second, third, and fourth light detection sensors LS1, LS2, LS3, and LS4 may be correspondingly disposed adjacent to four corners of each unit sensing area USA. In this case, the first to fourth effective sensing areas ASA1 to ASA4 may be at four corners of each unit sensing area USA in which the first to fourth light detection sensors LS1 to LS4 are disposed.

As shown in FIGS. 6B and 6D, the optical system OS may include a plurality of optical fibers. For example, the optical system OS may include a plurality of optical fibers that are disposed to correspond to each unit sensing area USA. In some exemplary embodiments of the present invention, each unit sensing area USA may be provided thereon with four optical fibers LF1, LF2, LF3, and LF4 (hereinafter referred to as first, second, third, and fourth optical fibers). The first optical fiber LF1 may be disposed to overlap the first light detection sensor LS1, and the second optical fiber LF2 may be disposed to overlap the second light detection sensor LS2. The third optical fiber LF3 may be disposed to overlap the third light detection sensor LS3, and the fourth optical fiber LF4 may be disposed to overlap the fourth light detection sensor LS4.

Each of the first to fourth optical fibers LF1 to LF4 may include a core part COP and a cladding part CDP provided to surround the core part COP. The core part COP may serve as the transmission part (see TP of FIG. 4A) that transmits light that is incident from the display unit DU, and the cladding part CDP may serve as the absorption part (see AP of FIG. 4A) that absorbs the incident light.

The core part COP may include an upper portion UP having a first diameter (see d1 of FIG. 5E) and a lower portion LP having a second diameter (see d2 of FIG. 5E) less than the first diameter d1. The lower portion LP may be as a portion that is closer than the upper portion UP to a corresponding one of the light detection sensors LS1 to LS4.

The lower portion LP of each of the first to fourth optical fibers LF1 to LF4 may be disposed to correspond to a corresponding one of the first to fourth effective sensing areas ASA1 to ASA4. For example, the lower portion LP of each of the first to fourth optical fibers LF1 to LF4 may overlap a corresponding one of the first to fourth light detection sensors LS1 to LS4.

The upper portion UP of each of the first to fourth optical fibers LF1 to LF4 may overlap a corresponding one of the first to fourth effective sensing areas ASA1 to ASA4, and may also overlap the ineffective sensing area NASA of the unit sensing area USA. For example, the first diameter d1 of the upper portion UP may be greater than the second diameter d2 of the lower portion LP. Therefore, light incident from the display unit DU may be effectively supplied to the core part COP through the upper portion UP whose diameter is large. The first diameter d1 of the upper portion UP may decrease as approaching the lower portion LP. Therefore, when each of the first to fourth optical fibers LF1 to LF4 is cut along the third direction DR3, the upper portion UP may have a funnel-shaped cross-section.

The lower portion LP of each of the first to fourth optical fibers LF1 to LF4 may guide light, which is incident through the upper portion UP, to a corresponding one of the first to fourth light detection sensors LS1 to LS4. The lower portion LP of each of the first to fourth optical fibers LF1 to LF4 may be disposed adjacent to a corresponding one of four corners of the unit sensing area USA. Therefore, when each of the first to fourth optical fibers LF1 to LF4 is cut along its longitudinal direction, the upper portion UP may have an asymmetrically funnel-shaped cross-section.

The ineffective sensing area NASA may be a region that includes a center of each unit sensing area USA, and the pressure detection sensor FS may be disposed in the ineffective sensing area NASA.

The pressure detection sensor FS may include a plurality of strain detection patterns FSP disposed in the ineffective sensing area NASA and a connection pattern CP that connects the plurality of strain detection patterns FSP to each other. As shown in FIG. 6A, the pressure detection sensor FS may include one pressure detection string. The pressure detection string may include the plurality of strain detection patterns FSP and the connection pattern CP. The present invention, however, is not limited thereto. For example, the pressure detection sensor FS may include two or more pressure detection strings. The pressure detection strings may have the same structure.

The pressure detection sensor FS may be disposed spaced apart from each of the first to fourth light detection sensors LS1 to LS4. For example, the plurality of strain detection patterns FSP and the connection pattern CP may not overlap the first to fourth light detection sensors LS1 to LS4 in a corresponding unit sensing area USA. In the ineffective sensing area NASA, the strain detection pattern FSP may overlap the cladding part CDP of each of the first to fourth optical fibers LF) to LF4. For example, the plurality of strain detection patterns FSP may be disposed below the cladding parts CDP of the first to fourth optical fibers LF1 to LF4. Therefore, externally applied pressure may be transferred to the plurality of strain detection patterns FSP through the cladding parts CDP of the first to fourth optical fibers LF1 to LF4.

Each of the plurality of strain detection patterns FSP may have a rhombic shape whose central region has an empty space formed therein. However, the shapes of the plurality of strain detection patterns FSP are not limited thereto. For example, each of the plurality of strain detection patterns FSP may have a circular shape, a tetragonal shape, an oval shape, or the like.

In some exemplary embodiments of the present invention, the central region of the rhombic shape may have at least one dummy pattern DSP whose size is less than that of the strain detection pattern FSP. The at least one dummy pattern DSP may have the same rhombic shape as that of the strain detection pattern FSP. The dummy pattern DSP may be electrically connected to or separated from the strain detection pattern FSP.

The plurality of strain detection patterns FSP may be spaced apart from each other in the second direction DR2, and may be connected to each other through the connection pattern CP.

The pressure detection sensor FS may further include a first voltage line VL1 connected to one end of the pressure detection string, a second voltage line VL2 connected to another end of the pressure detection string, a first strain line SNL connected to an input end of the pressure detection string, and a second strain line SPL connected to an output end of the pressure detection string.

The first voltage line VL1 may be supplied with a driver voltage, and the second voltage line VL2 may be supplied with a ground voltage. The first strain line SNL may be input with a driver signal, and the second strain line SPL may output a resistance difference measured by pressure.

The non-sensing area NSA of the base substrate BS may include a first voltage pad VPD1, a second voltage pad VPD2, a first strain pad SND, and a second strain pad SPD. The first voltage pad VPD1 may be connected to the first voltage line VL1, and the second voltage pad VPD2 may be connected to the second voltage line VL2. The first strain pad SND may be connected to the first strain line SNL, and the second strain pad SPD may be connected to the second strain line SPL.

Accordingly, the pressure detection sensor FS may be externally supplied with the driver voltage, the ground voltage, and the driver signal, and may output the resistance difference measured by pressure.

For example, the pressure detection sensor FS according to the embodiment shown in FIG. 6B may include the strain detection pattern FSP that is formed to have a size greater than that of the strain detection pattern FSP shown in FIG. 5A. Therefore, the pressure detection sensor FS of FIG. 6B may have increased sensibility. The biometric information sensing unit BSU may effectively detect the occurrence of a user's touch event, and may thus decrease a time required for initiating an operation of the first to fourth light detection sensors LS1 to LS4. As a result, it may be possible to reduce a standby time of the first to fourth light detection sensors LS1 to LS4.

Figure 7A:
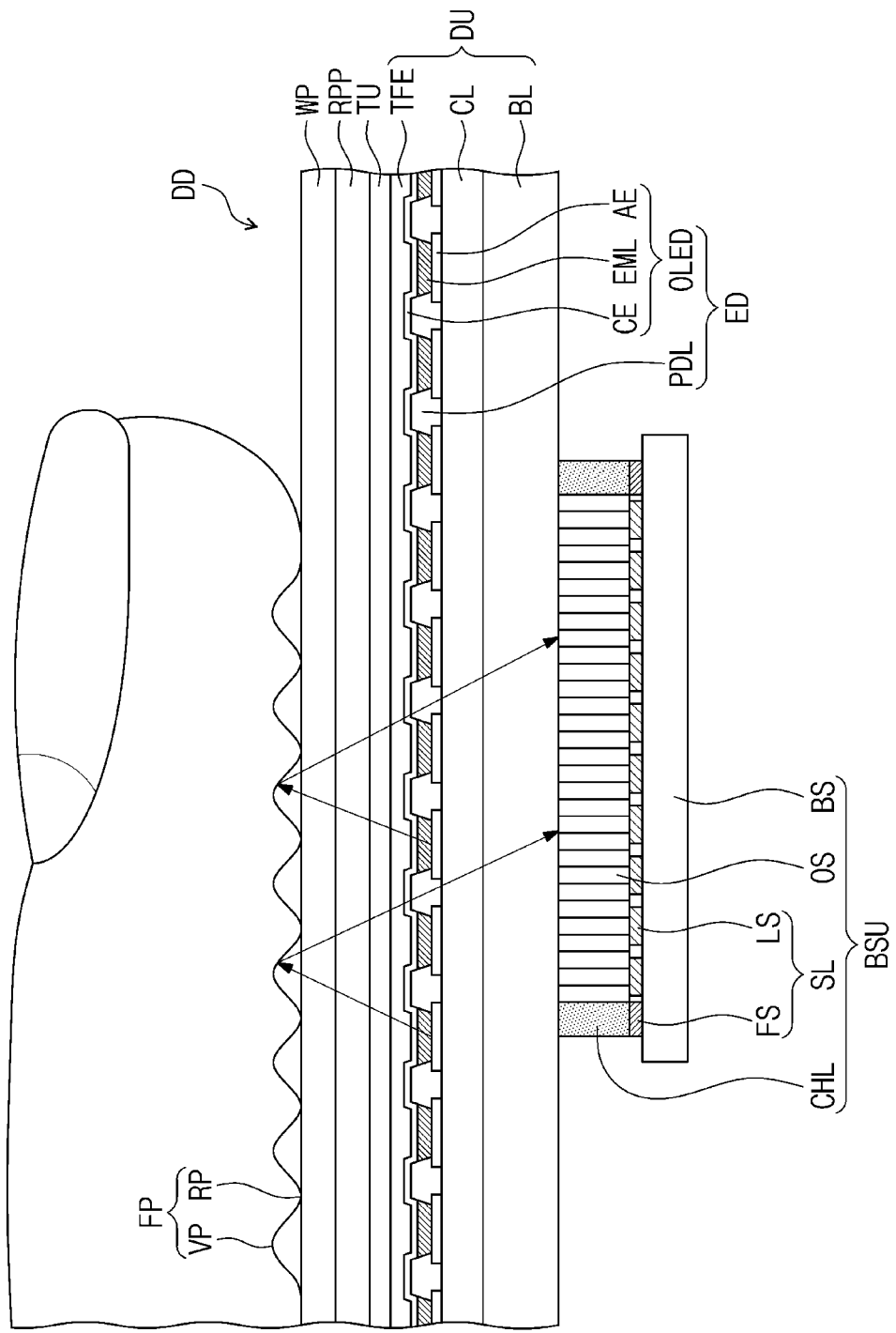
FIG. 7A illustrates an enlarged cross-sectional view showing a biometric information sensing unit according to some exemplary embodiments of the present invention.
Figure 7B:
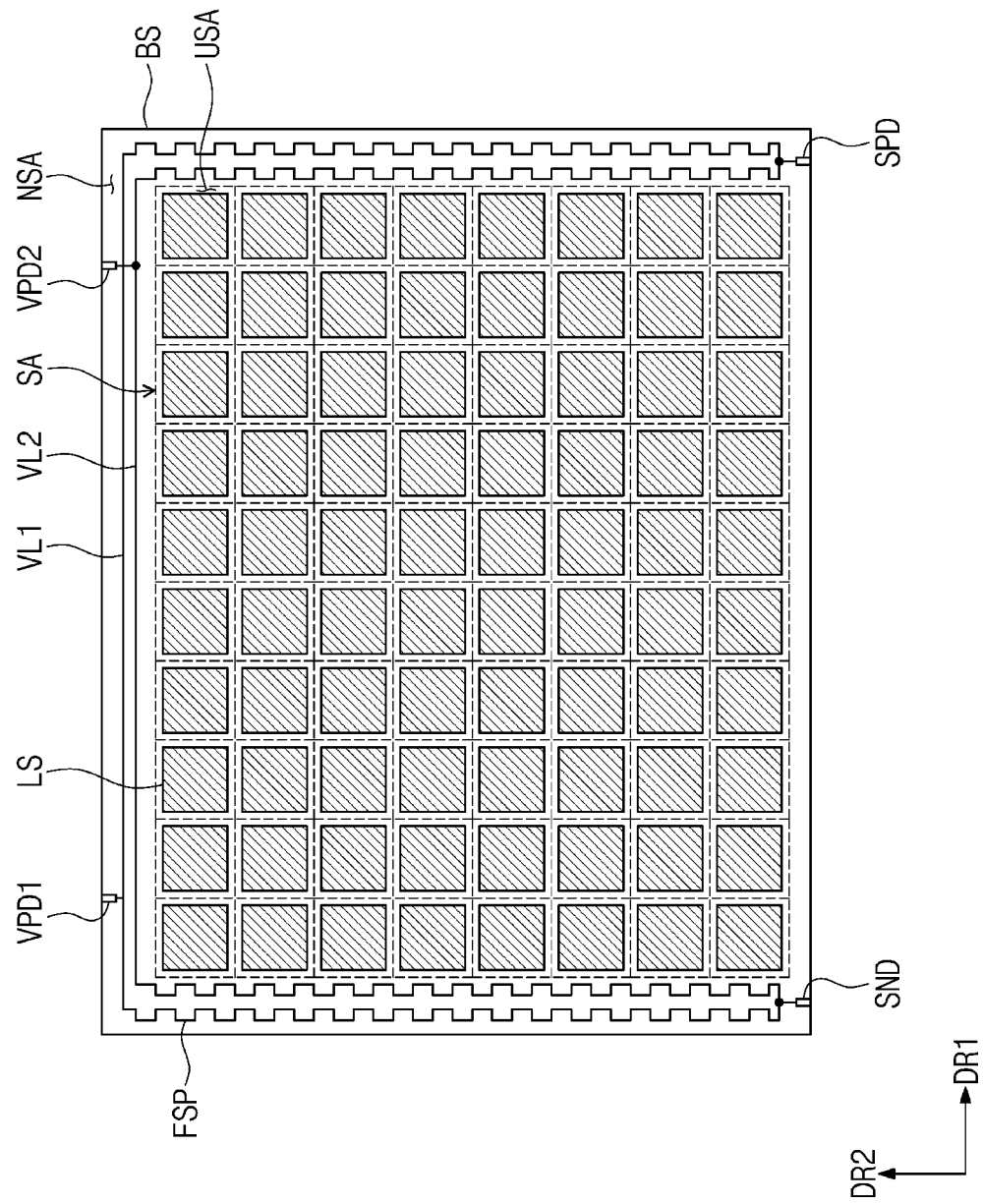
FIG. 7B illustrates a plan view showing a light detection sensor and a pressure detection sensor according to some exemplary embodiments of the present invention.
Figure 7C:
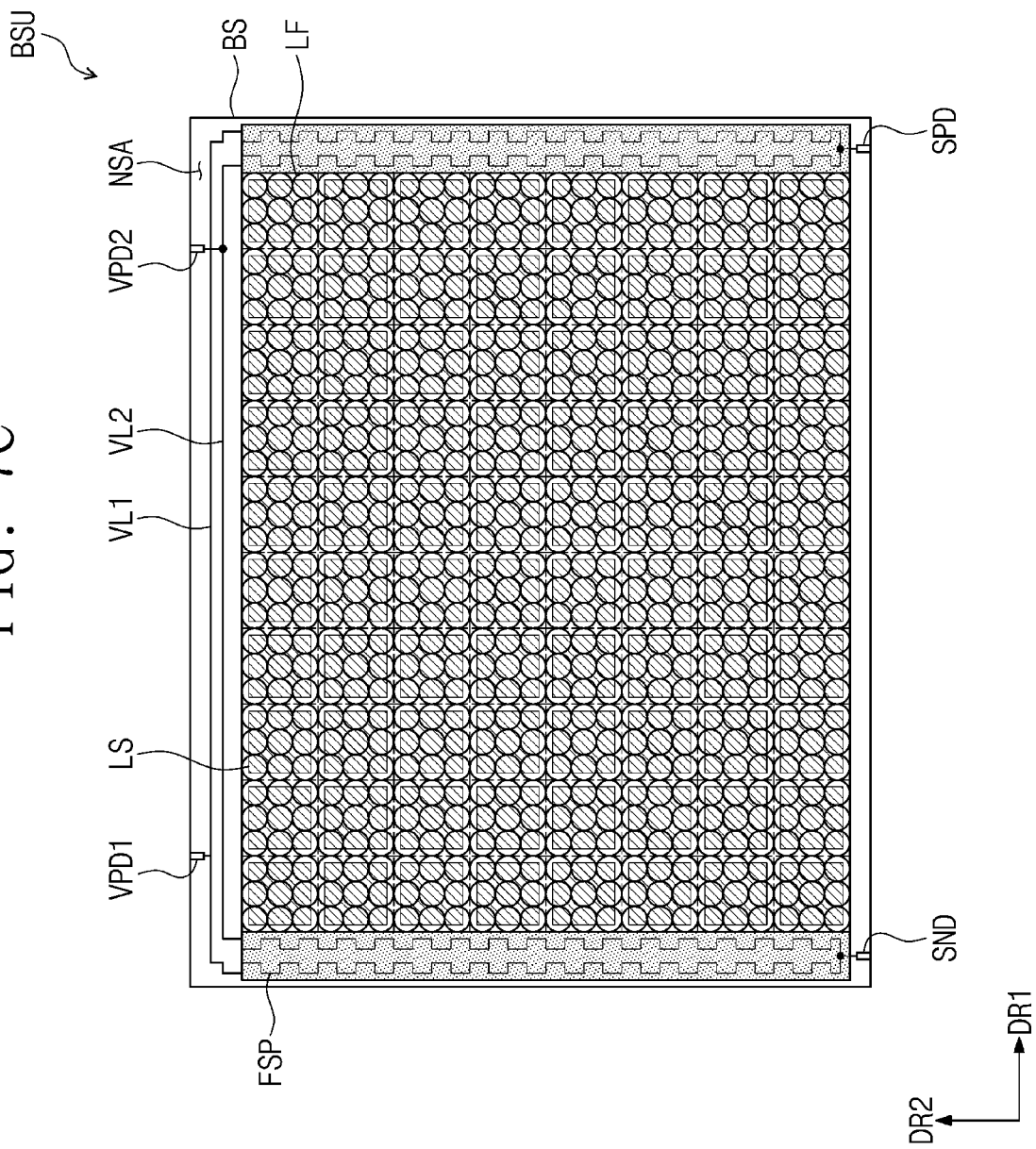
FIG. 7C illustrates a plan view showing an arrangement relationship between an optical system, a light detection sensor, and a pressure detection sensor according to some exemplary embodiments of the present invention.

FIG. 7A illustrates an enlarged cross-sectional view showing a biometric information sensing unit according to some exemplary embodiments of the present invention. FIG. 7B illustrates a plan view showing a light detection sensor and a pressure detection sensor according to some exemplary embodiments of the present invention. FIG. 7C illustrates a plan view showing an arrangement relationship between an optical system, a light detection sensor, and a pressure detection sensor according to some exemplary embodiments of the present invention. In the following embodiment illustrated in FIG. 7A, the same components as those shown in FIG. 4A are allocated the same reference numerals or symbols, and accordingly repetitive explanations will be omitted.

Referring to FIGS. 7A to 7C, the biometric information sensing unit BSU may include a base substrate BS, a sensing layer SL, an optical system OS, and a cushion layer CHL.

The base substrate BS may include a sensing area SA and a non-sensing area NSA. The non-sensing area NSA may be provided to surround the sensing area SA. The sensing area SA may include a plurality of unit sensing areas USA that are arranged in a matrix shape. The sensing layer SL may be disposed in the sensing area SA of the base substrate BS. The sensing layer SL may include a plurality of light detection sensors LS and a pressure detection sensor FS. The plurality of light detection sensors LS may be correspondingly disposed in the plurality of unit sensing areas USA.

The optical system OS may include a plurality of optical fibers LF. The optical fibers LF may be transparent to light incident on the biometric information sensing unit BSU.

The light detection sensors LS may be disposed in the sensing area SA of the base substrate BS. In the sensing area SA, the light detection sensors LS may be correspondingly disposed below the plurality of optical fibers LF and may receive light that passes through the optical fibers LF. For example, the optical fibers LF may prevent the light detection sensors IS from receiving light other than light that is incident after being reflected from a user's finger.

Each light detection sensor IS may include a photosensitive transistor. The photosensitive transistor may receive light provided through the optical fibers LF, and may output current that corresponds to intensity of the incident light.

The pressure detection sensor FS may be disposed in the non-sensing area NSA of the base substrate BS. The pressure detection sensor FS may include a plurality of strain detection patterns FSP disposed in the non-sensing area NSA. Because the pressure detection sensor FS is disposed in the non-sensing area NSA, each of the light detection sensors LS may have an increased size, compared to the case where the pressure detection sensor FS is disposed in the sensing area SA in the embodiments shown in FIGS. 4A to 6D.

Therefore, each of the light detection sensors LS may increase its capacity and sensitivity in recognizing biometric information such as fingerprint recognition.

The cushion layer CH L may be provided on the pressure detection sensor FS, and may transfer externally applied pressure to the pressure detection sensor FS. The cushion layer CHL may include a material capable of absorbing pressure externally provided from the outside. In some exemplary embodiments of the present invention, the cushion layer CHL may include an organic dielectric material.

Each of the strain detection patterns FSP may extend along the second direction DR2. Each of the strain detection patterns FSP may include a metallic material. Each of the strain detection patterns FSP may have a structure that is bent several times.

In some exemplary embodiments of the present invention, the pressure detection sensor FS may include one pressure detection string that includes a plurality of strain detection patterns FSP. The pressure detection sensor FS may further include a first voltage line VL1 connected to one end of the pressure detection string, a second voltage line VL2 connected to another end of the pressure detection string, a first strain pad SND, and a second strain pad SPD.

The first voltage line VL1 may be supplied with a driver voltage, and the second voltage line VL2 may be supplied with a ground voltage. The first strain pad SND may be input with a driver signal, and the second strain pad SPD may output a resistance difference measured by pressure.

Pads VPD1 and VPD2 may be disposed in the non-sensing area NSA of the base substrate BS. The pads VPD1 and VPD2 may include a first voltage pad VPD1 and a second voltage pad VPD2. The first voltage pad VPD1 may be connected to the first voltage line VL, and the second voltage pad VPD2 may be connected to the second voltage line VL2.

Accordingly, the pressure detection sensor FS may be externally supplied with the driver voltage, the ground voltage, and the driver signal, and may output the resistance difference measured by pressure.

The biometric information sensing unit BSU may be configured such that the pressure detection sensor FS is provided in the non-sensing area NSA that does not affect a size of the light detection sensor IS, and thus it is possible to reduce a standby time of the light detection sensor LS while maintaining excellent fingerprint recognition.

In display devices, according to exemplary embodiments of the present invention, a biometric information sensing unit for biometric information recognition may include a light detection sensor together with a pressure detection sensor for initiating an operation of the light detection sensor, which results in a reduction in standby time when initiating the light detection sensor.

While the present invention has been described with reference to exemplary embodiments thereof, it is understood that various changes and modifications can be made thereto by one of ordinary skill in the art without departing from the spirit and scope of the present invention as set forth in the attached claims.

What is claimed is:

1. A display device, comprising:
a display unit including a light emitting element that emits light; and
a biometric information sensing unit disposed below the display unit, wherein the biometric information sensing unit receives light reflected by a biometric input,
wherein the biometric information sensing unit comprises:

an optical system including a transmission part that passes the reflected light and an absorption part around the transmission part, wherein the absorption part absorbs the reflected light and pressure;

a light detection sensor disposed below the transmission part of the optical system, wherein the light detection sensor receives the reflected light that passes through the transmission part; and a pressure detection sensor disposed below the absorption part of the optical system, wherein the pressure detection sensor detects the pressure that is transferred from the absorption part.

2. The display device of claim 1, wherein the biometric information sensing unit further comprises a base substrate which includes a sensing area and a non-sensing area that surrounds the sensing area.

3. The display device of claim 2, wherein the light detection sensor and the pressure detection sensor are disposed in the sensing area of the base substrate.

4. The display device of claim 3, wherein the sensing area comprises an effective sensing area and an ineffective sensing area, wherein the light detection sensor is disposed in the effective sensing area, and wherein the pressure detection sensor is disposed in the ineffective sensing area.

5. The display device of claim 4, wherein the pressure detection sensor comprises a pressure detection string.

6. The display device of claim 5, wherein the pressure detection string comprises:

a plurality of strain detection patterns in the ineffective sensing area; and a connection pattern that connects the plurality of strain detection patterns to each other.

7. The display device of claim 3, wherein the sensing area comprises a plurality of unit sensing areas arranged in a matrix shape, wherein the light detection sensor is disposed in each of the plurality of unit sensing areas.

8. The display device of claim 7, wherein the optical system comprises a plurality of optical fibers arranged in a matrix shape, wherein the plurality of optical fibers correspond to the plurality of unit sensing areas, respectively.

9. The display device of claim 8, wherein each of the plurality of optical fibers comprises:

a core part that serves as the transmission part; and a cladding part that surrounds the core part and serves as the absorption part.

10. The display device of claim 9, wherein the core part comprises:

a lower portion having a first diameter; and an upper portion having a second diameter greater than the first diameter, wherein the lower portion is closer than the upper portion to the light detection sensor.

11. The display device of claim 10, wherein the second diameter of the upper portion decreases as it approaches the lower portion.

12. The display device of claim 3, wherein the sensing area comprises a plurality of unit sensing areas arranged in a matrix shape, wherein each of the plurality of unit sensing areas comprises a plurality of effective sensing areas and an ineffective sensing area that is adjacent to the plurality of effective sensing areas.

13. The display device of claim 12, wherein the light detection sensor comprises a plurality of light detection sensors that are correspondingly provided in the plurality of effective sensing areas, and the pressure detection sensor is provided in the ineffective sensing area.

14. The display device of claim 13, wherein each of the plurality of unit sensing areas has a tetragonal shape, and the plurality of effective sensing areas are located at corners of each unit sensing area.

15. The display device of claim 13, wherein the optical system comprises a plurality of optical fibers which correspond to the plurality of light detection sensors, respectively.

16. The display device of claim 1, wherein the light detection sensor comprises a photosensitive transistor.

17. A display device, comprising:

a display unit including a light emitting element that emits light; and a biometric information sensing unit disposed below the display unit, wherein the biometric information sensing unit receives light reflected by a biometric input, wherein the biometric information sensing unit comprises:

a base substrate including a sensing area and a non-sensing area that surrounds the sensing area;

an optical system in the sensing area, wherein the optical system receives the reflected light;

a light detection sensor disposed in the sensing area of the base substrate and below the optical system, wherein the light detection sensor receives the reflected light from the optical system;

a cushion layer disposed in the non-sensing area of the base substrate, wherein the cushion layer absorbs external pressure; and a pressure detection sensor disposed in the non-sensing area of the base substrate and below the cushion layer, wherein the pressure detection sensor detects the pressure transferred from the cushion layer.

18. The display device of claim 17, wherein the pressure detection sensor comprises a plurality of strain detection patterns.

19. The display device of claim 17, wherein the optical system comprises a plurality of optical fibers arranged in the sensing area, wherein the cushion layer is adjacent to the plurality of optical fibers and disposed in the non-sensing area.

20. The display device of claim 17, wherein the light detection sensor comprises a photosensitive transistor.

* * * * *